US009275886B2

(12) United States Patent
Fujimoto et al.

(10) Patent No.: US 9,275,886 B2
(45) Date of Patent: Mar. 1, 2016

(54) DEVICE AND METHOD FOR DETECTING POSITION OF SEMICONDUCTOR SUBSTRATE

(71) Applicant: RORZE CORPORATION, Hiroshima (JP)

(72) Inventors: Keiji Fujimoto, Hiroshima (JP); Yasuharu Yamamoto, Hiroshima (JP)

(73) Assignee: Rorze Corporation (JP)

( * ) Notice: Subject to any disclaimer, the term of this patent is extended or adjusted under 35 U.S.C. 154(b) by 0 days.

(21) Appl. No.: 14/438,189

(22) PCT Filed: Oct. 23, 2013

(86) PCT No.: PCT/JP2013/078644
§ 371 (c)(1),
(2) Date: Apr. 23, 2015

(87) PCT Pub. No.: WO2014/069291
PCT Pub. Date: May 8, 2014

(65) Prior Publication Data
US 2015/0287625 A1    Oct. 8, 2015

(30) Foreign Application Priority Data
Oct. 29, 2012   (JP) .................................. 2012-238373

(51) Int. Cl.
*G06K 9/00*   (2006.01)
*H01L 21/68*   (2006.01)
(Continued)

(52) U.S. Cl.
CPC ............ *H01L 21/681* (2013.01); *G01B 11/002* (2013.01); *G06T 7/004* (2013.01); *G06T 7/0004* (2013.01); *H01L 21/67253* (2013.01); *G06T 2207/30148* (2013.01)

(58) Field of Classification Search
None
See application file for complete search history.

(56) References Cited

U.S. PATENT DOCUMENTS 5,194,743 A * 3/1993 Aoyama ............... H01L 21/681
                                                            250/548
6,760,976 B1 * 7/2004 Martinson ......... H01L 21/67265
                                                            33/520
(Continued)

FOREIGN PATENT DOCUMENTS

JP   09-120986   5/1997
JP   09-186061   7/1997
(Continued)

OTHER PUBLICATIONS

International Search Report dated Dec. 17, 2013 for International Application No. PCT/JP2013/078644, 2 pages.
(Continued)

*Primary Examiner* — Daniel Mariam
(74) *Attorney, Agent, or Firm* — Merek, Blackmon & Voorhees, LLC

(57) ABSTRACT

Provided is a position detecting device that is capable of precisely detecting the coordinates of the center of a disc-shaped substrate from image data captured by one camera, calculating the amount of positional misalignment of the disc-shaped substrate on a support member as the disc-shaped substrate is being transported during processing, and correcting the position such that the substrate can be located at the precise loading position. Isosceles right triangles, each having the radius of the disc-shaped substrate as one side, are generated from the coordinates of two places on edge data extracted from the image data and the radius on the edge data, and the coordinates of the center position of the disc-shaped substrate are detected by using the Pythagorean theorem.

8 Claims, 14 Drawing Sheets

(51) Int. Cl.
*G01B 11/00* (2006.01)
*H01L 21/67* (2006.01)
*G06T 7/00* (2006.01)

(56) References Cited

U.S. PATENT DOCUMENTS

| | | | |
|---|---|---|---|
| 7,519,448 B2* | 4/2009 | Ikeda | G01B 11/002 382/151 |
| 2006/0169208 A1* | 8/2006 | Shinozaki | G03F 7/7075 118/715 |
| 2010/0124610 A1* | 5/2010 | Aikawa | C23C 16/4584 427/255.28 |

FOREIGN PATENT DOCUMENTS

| | | |
|---|---|---|
| JP | 2003-152055 | 5/2003 |
| JP | 2005-164579 | 6/2005 |
| JP | 2009-123790 | 6/2009 |
| JP | 2010-182966 | 8/2010 |
| JP | 2010-186863 | 8/2010 |
| JP | 2010-283280 | 12/2010 |

OTHER PUBLICATIONS

International Preliminary Report on Patentability dated Nov. 21, 2014 for International Application No. PCT/JP2013/078644, 10 pages.

* cited by examiner

DEVICE AND METHOD FOR DETECTING POSITION OF SEMICONDUCTOR SUBSTRATE

FIELD OF THE INVENTION

The present invention relates to a device for detecting a position of a disc-shaped substrate such as a semiconductor wafer, a method therefor, and a method for correcting the position thereof.

BACKGROUND OF THE INVENTION

In manufacturing a general semiconductor integrated circuit, an integrated circuit having a fine pattern is formed by repeatedly performing various processes such as exposure, deposition process, etching process and heat treatment on the substrate such as a semiconductor wafer.

Thus various processes are performed by using a substrate processing apparatus having a processing chamber configured of exclusive instruments for performing respective processes. The substrate processing apparatus is composed by connecting one or several various processing chambers to a transport chamber for storing a conveyance robot. The conveyance robot is provide with a conveyance arm for mounting and transporting the disc-shaped substrate such as a semiconductor wafer at the center. Further, the transport chamber and the processing chambers are provided with means for maintaining each inner part in a vacuum environment, and connected to each other through gate valves. Here, the disc-shaped substrate held by the conveyance robot is transported, mounted on a mounting table installed to the processing chamber by using the conveyance arm, and then, the various processes are performed on the disk-shaped substrate.

The substrate processing apparatus is required to precisely transport the substrate at a predetermined position of the mounting table in order to appropriately process the disc-shaped substrate mounted on the mounting table. Therefore, the substrate processing apparatus needs the disc-shaped substrate precisely positioned on the predetermined position of the mounting table in the processing chamber. After first detecting positional misalignment of the objective disc-shaped substrate, if a positional misalignment occurs, the disk-shaped substrate needs to be located on the predetermined position by correcting the positional misalignment. Specially, it is difficult to directly detect the position of the disc-shaped substrate in the processing chamber because of processes executed or substance used/deposited in the processes. Therefore, it is necessary to detect the position of the disc-shaped substrate in the predetermined place within the transport chamber which is connected with the processing chamber.

In a conventional method for detecting position of the disc-shaped substrate, for example, like in patent literature 1, the disc-shaped substrate is mounted on a rotatable pedestal, the periphery is detected by a line sensor as being rotated, and the positional misalignment is detected based on a rotation angle of the pedestal and detection results from the line sensor.

However, the rotatable pedestal and the line sensor must be installed into the transport chamber with the method disclosed in Patent literature 1, and therefore, this requires increasing the size of the transport chamber. Further, the disc-shaped substrate held by the conveyance robot requires a series of actions for detecting the positional misalignment by being once mounted on the pedestal and rotated, therefore causing the problem that throughput is reduced.

Accordingly, recently, as disclosed in Patent literature 2, the peripheral part of the semiconductor wafer has been captured for a plurality of times, and the position of the semiconductor wafer has been detected based on the captured images. That is, a plurality of cameras are located on the upper surface outside the transport chamber and a light source is located on the undersurface outside the transport chamber opposing the cameras. The cameras are positioned so as to pick up images of the peripheral part of the semiconductor wafer being transported in the transport chamber, and capture the peripheral part in passing timing of the semiconductor wafer. Here, the position is detected based on image data capturing a plurality of peripheral parts.

PRIOR ART

Patent Literature

Patent literature 1: Japanese Patent Laid Open Publication No. 2003-152055

Patent literature 2: Japanese Patent Laid Open Publication No. 09-186161

DISCLOSURE OF THE INVENTION

Problems to be Solved by the Invention

According to the method of Patent literature 2, since the equipment used for positioning the semiconductor wafer does not need to be located in the transport chamber, an occupied area in the transport chamber can be made small. However, the plurality of cameras are required to capture a plurality of edges on the outer peripheral edge of the semiconductor wafer. Further, it is necessary to provide with a plurality of viewports for capturing or a large diameter viewport capable of observing the whole wafer in the transport chamber.

The viewport functions as a peephole for grasping a condition within the transport chamber from outside, and seals an opening formed to the transport chamber with a transparent member such as tempered glass Therefore, to observe the interior condition from the outside, it is impossible to locate any equipment for maintaining a vacuum environment on the viewport. Further, when the viewport has a large diameter, a problem occurs in the strength in keeping the inside in a vacuum state. Furthermore, a plurality of expensive cameras must be installed to pick up images, thereby causing an increase in costs.

The present invention is devised to solve the above-mentioned problems, and to detect the precise position of the disc-shaped substrate of the semiconductor wafer from the image data captured by one camera.

Means to Solve the Problem

To solve the above mentioned problems, a position detecting device related to the present invention detects a position of a disc-shaped substrate held by a support member movable along a predetermined track, being characterized by including one imaging camera for capturing the periphery of the disc-shaped substrate when the support member holding the disc-shaped substrate is positioned at a predetermined monitoring position, an edge extraction section for extracting the edge of the disc-shaped substrate from image data of the periphery of the disc-shaped substrate captured by the camera, and a coordinate detection section for detecting coordinates of the center position of the disc-shaped substrate from edge data extracted by the edge extraction section. According to this structure, the coordinates of the center position of the disc-shaped substrate can be detected from the images captured by one imaging camera.

In addition, the imaging camera enables the precision of the coordinate detection to be improved by capturing only a part of the periphery of the disc-shaped substrate because the number of captured cells per unit area can be increased in comparison with the case of capturing the whole.

Further, the coordinate detection section is capable of detecting the coordinates of the center position only by capturing only a part of the periphery of the disc-shaped substrate by detecting the coordinates of the center position of the disc-shaped substrate from the coordinates of two places on the edge data and the radius of the disc-shaped substrate.

Moreover, the coordinate detection section is capable of precisely calculating the coordinates of the center position by firstly generating two isosceles right triangles each having one side of the radius of the disc-shaped substrate from the coordinates of two places on the edge data and the radius of the disc-shaped substrate and then detecting the coordinates of the center position of the disc-shaped substrate from the Pythagorean Theorem.

Furthermore, the coordinate detection section is capable of detecting the coordinates of the center position of the disc-shaped substrate without using the radius by detecting the coordinates of the center position from the coordinates of three places on the edge data, namely, the coordinates of the center position can be detected even though the radius is unknown.

Further, the coordinate detection section is capable of calculating the coordinates of the center position from the Pythagorean Theorem by generating three isosceles right triangles each having one side of the radius of the disc-shaped substrate from the coordinates of three places on the edge data and the radius of the disc-shaped substrate.

The position detecting device is further provided with a correction amount calculation section for calculating a correction amount of the support member by calculating the amount of misalignment in the X-axis direction and in the Y-axis direction between the coordinates of the center position of the disc-shaped substrate held at the reamer reference position of the support member and the coordinates of the center position of the disc-shaped substrate being transported during processing and generating positional misalignment, thereby enabling calculation of a correction amount of the conveyance robot.

Further, a technology related to the present invention provides a position detecting method for being performed by the above-mentioned position detecting device. The position detecting method is to detect the position of the disk-shaped substrate held by a support member movable along a predetermined track, being characterized by including an imaging process for capturing the periphery of the disc-shaped substrate by one camera when the support member holding the disc-shaped substrate is positioned at a predetermined monitoring position, an edge extracting process for extracting the edge of the disc-shaped substrate from image data of the periphery of the disc-shaped substrate captured by the camera, and a coordinate detecting process for detecting coordinates of the center position of the disc-shaped substrate from edge data extracted by the edge extracting process.

Moreover, the imaging process enables the precision of the coordinate detection to be improved by capturing only a part of the periphery of the disc-shaped substrate because the number of captured cells per unit area can be increased in comparison with the case of capturing the whole.

Furthermore, the coordinate detecting process is capable of detecting the coordinates of the center position of the disc-shaped substrate from the coordinates of two places on the edge data and the radius of the disc-shaped substrate, thereby enabling to detect the coordinates of the center position only by capturing only a part of the periphery of the disc-shaped substrate.

Further, the coordinate detecting process is capable of precisely calculating the coordinates of the center position of the disc-shaped substrate by firstly generating two isosceles right triangles each having one side of the radius of the disc-shaped substrate from the coordinates of two places on the edge data and the radius of the disc-shaped substrate and then detecting the coordinates of the center position from the Pythagorean Theorem.

Further, the coordinate detecting process is capable of detecting the coordinates of the center position of the disc-shaped substrate without using the radius and besides by detecting the coordinates of the center position from the coordinates of three places on the edge data, thereby enabling to detect the coordinates of the center position even though the radius is unknown.

Further, the coordinate detecting process is capable of calculating the coordinates of the center position from the Pythagorean Theorem by generating three isosceles right triangles each having one side of the radius of the disc-shaped substrate from the coordinates of three places on the edge data and the radius of the disc-shaped substrate.

The position detecting method is further provided with a correction amount calculating process for calculating a correction amount of the support member by calculating the amount of misalignment in the X-axis direction and in the Y-axis direction between the coordinates of the center position of the disc-shaped substrate held at the reamer reference position of the support member and the coordinates of the center position of the disc-shaped substrate being transported during processing and generating positional misalignment, thereby enabling calculation of a correction amount of the conveyance robot.

Further, a position detecting device related to the present invention detects a position of a disc-shaped substrate held by a support member movable along a predetermined track, being characterized by including an imaging camera for capturing the periphery of the disc-shaped substrate within a viewing field of an intersection C where a straight line U parallel to Y-axis passing through the center of the disc-shaped substrate intersects the edge of the disc-shaped substrate when the support member holding the disc-shaped substrate is positioned at a predetermined monitoring position, having cells arranged in an orthogonal XY coordinates system, an edge extraction section for extracting a Y coordinate value of the intersection C from image data of the periphery of the disc-shaped substrate captured by the imaging camera and further extracting XY coordinates of an arbitrary location apart from the intersection C on the edge of the disc-shaped substrate which has been captured within the range of the viewing field, and a coordinate detection section for detecting coordinates of the center position of the disc-shaped substrate from the Y coordinate value of the intersection C extracted by the edge extraction section and the XY coordinates at the arbitrary location.

Effects of Invention

According to the present invention, the coordinates of the center position of the disc-shaped substrate can be detected by capturing the disc-shaped substrate by one camera. In addition, the coordinates of the center position can be detected by capturing a part of the periphery of the disc-shaped substrate, thereby enabling to increase the number of cells per unit area. Therefore, it is possible to more precisely detect the position coordinates. Further, since an even low resolution image camera can acquire high detection precision, a high resolution image camera is not necessary, thereby contributing to cost reduction.

PREFERRED EMBODIMENT OF THE INVENTION

Figure 1:
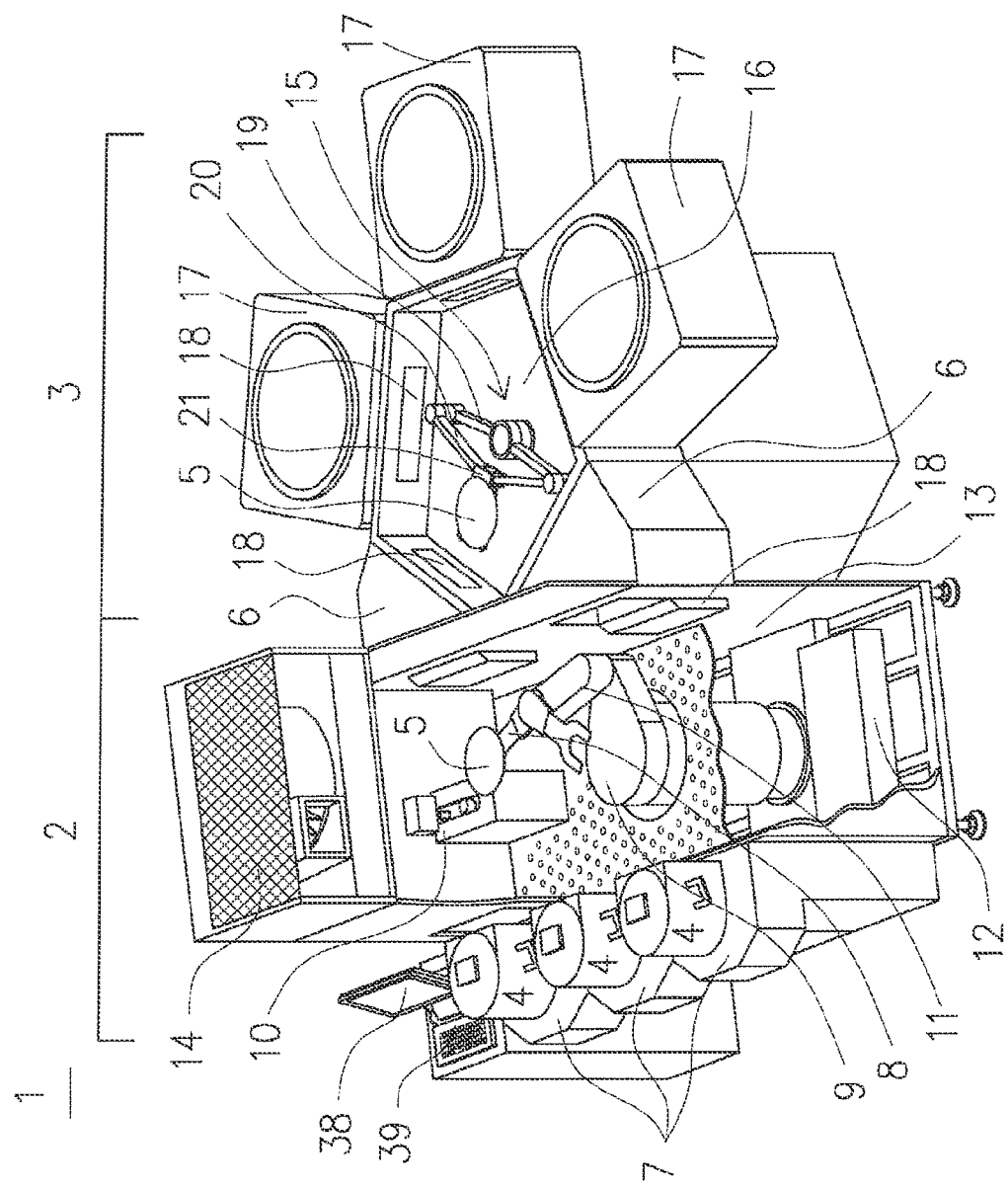
FIG. 1 is a perspective view showing a semiconductor manufacturing system with a position detecting devise of the present invention.
Figure 2:
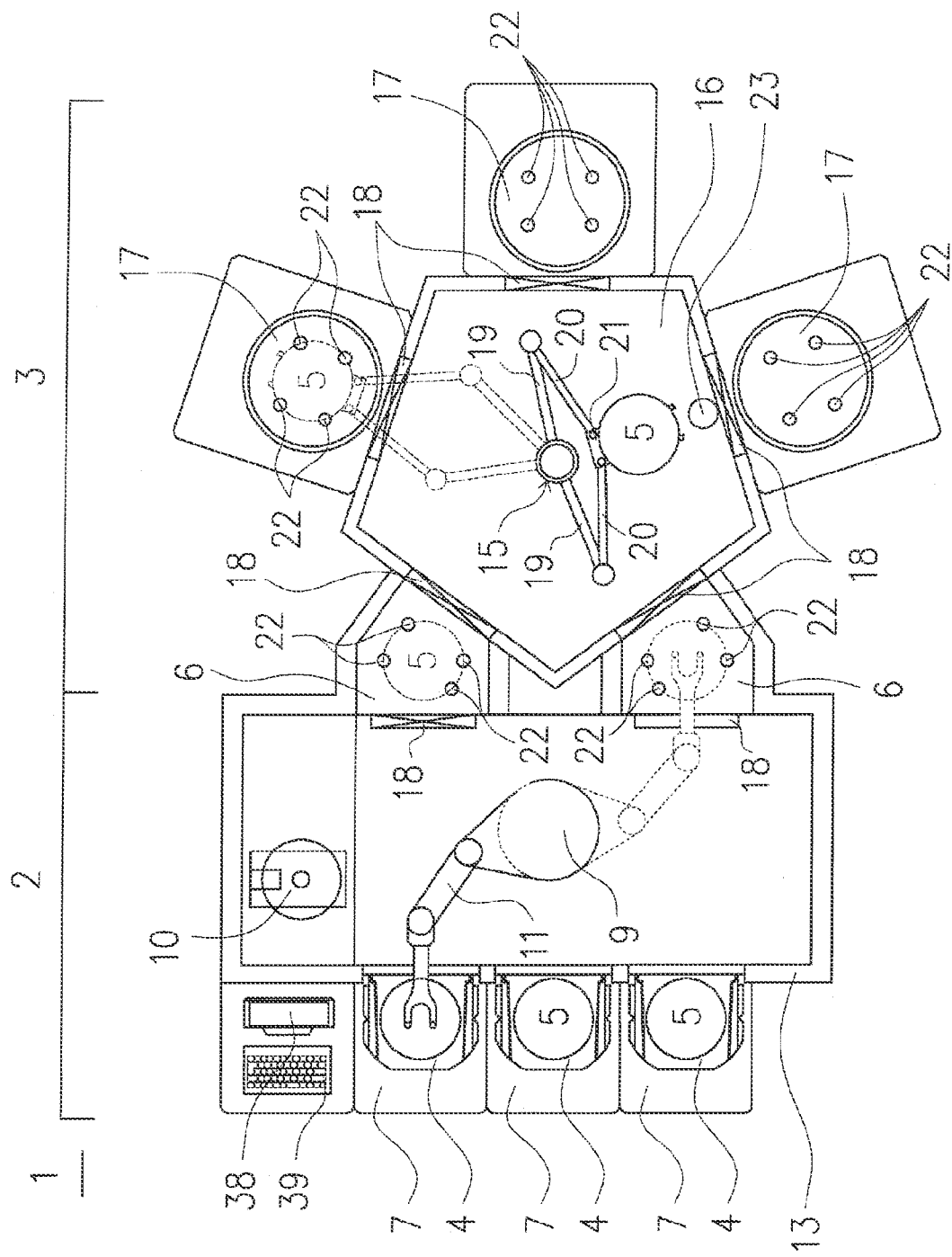
FIG. 2 is a top view showing a semiconductor manufacturing system with a position detecting devise of the present invention.

Embodiments of the invention will be explained in detail with reference to the drawings below. FIG. 1 is a perspective view showing outline of a semiconductor manufacturing system 1 having a position detecting devise 29 related to the present invention, FIG. 2 is a top view thereof. Generally, the semiconductor manufacturing system 1 includes an EFEM (Equipment Front End Module) 2 for precisely loading a disc-shaped substrate, which has been stored and carried from the previous process on a shelf inside an enclosure called FOUP (Front-Opening Unified Pod) 4, such as a semiconductor wafer 5, and a processing device 3 for conducting various processing on a surface of the semiconductor wafer 5.

The EFEM 2 is a device for transporting the semiconductor wafer 5 between the FOUP 4 and the processing device 3, including a load port for loading the FOUP 4 and for opening and closing a door of the FOUP 4, an atmospheric conveyance robot 9 for transporting the semiconductor wafer 5 stored in the FOUP 4 to the processing device 3 through a predetermined path as holding with a finger 8, and a device called an aligner 10 for centering the semiconductor wafer 5 and positioning the semiconductor wafer 5 in the rotational direction by identifying an orientation flat or a notch that is formed on the semiconductor wafer 5. The aligner 10 is provided with a linear sensor for detecting a peripheral rim part of the semiconductor wafer 5 and a rotating mechanism for controlling a rotation angle as holding the semiconductor wafer 5, positions the orientation flat or the notch formed on the peripheral rim part of the semiconductor wafer 5 in the rotational direction, and besides, executes alignment processing for locating the center position of the semiconductor wafer 5 at a proper position.

The atmospheric conveyance robot 9 is provided with the finger 8 for holding the semiconductor wafer 5 and a conveyance arm 11 which is constructed so as to flex, rotate and move up and down, and transports the semiconductor wafer 5 among the FOUP 4, the aligner 10 and the processing device 3. A movement of each axis of the load port 7, the aligner 10 and the atmospheric conveyance robot 9 is controlled by a control part 12 which is arranged in the EFEM 2. The control part 12 stores coordinate data or path data when the atmospheric conveyance robot 9 accesses in advance, and issues an operation instruction to each working axis of the atmospheric conveyance robot 9. Further, the control part 12 calculates the notch position and the center position of the semiconductor wafer 5 from the date of the peripheral rim of the semiconductor wafer 5 detected with the linear sensor, turns the semiconductor wafer 5 so that the notch position is adjusted in the predetermined direction, and gives an instruction to the aligner 10 so that the center position is aligned to the proper position.

Further, all sides of a space in which the atmospheric conveyance robot 9 holds and transports the semiconductor wafer 5 are covered with a partition 13 composed of a frame and a cover, and FFU (Fun Filter Unit) 14 is provided on the roof of the partition 13. The FFU 14 filters air which is introduced from the outside through a fun by a filter to supply it into the EFEM 2 as a clean downward streamline flow. According to the downward flow, the inside of the EFEM 2 is always kept in clean environment.

The processing device 3 is provided with a transport chamber 16 in which a vacuum conveyance robot 15 is located, processing chambers 17 for executing various processing to the semiconductor wafer 5, which are located around the transport chamber 16, load-lock chambers 6 for carrying the semiconductor wafer 5 in/out the outside, and an unillustrated environment maintenance means for keeping the insides of the transport chamber 16, the processing chambers 17 and the load-lock chambers 6 in vacuum environment or low oxygen atmosphere. Freely openable/closable gate valves 18 are respectively provided between the transport chamber 16 and each processing chamber 17 and between the transport chamber 16 and each load-lock chamber 6. Each chamber is capable of being air-tightly closed. These chambers are communicated to each other by opening the gate valves 18. Besides, the gate valves 18 are restricted so that two or more gate valves 18 cannot be simultaneously opened to secure the vacuum environment or the low oxygen atmosphere of each chamber. That is, when opening one gate valve 18, the other gate valves 18 need to be completely closed, and therefore, the other gate valves 18 cannot be opened until the opened gate valve 18 is completely closed.

Figure 3:
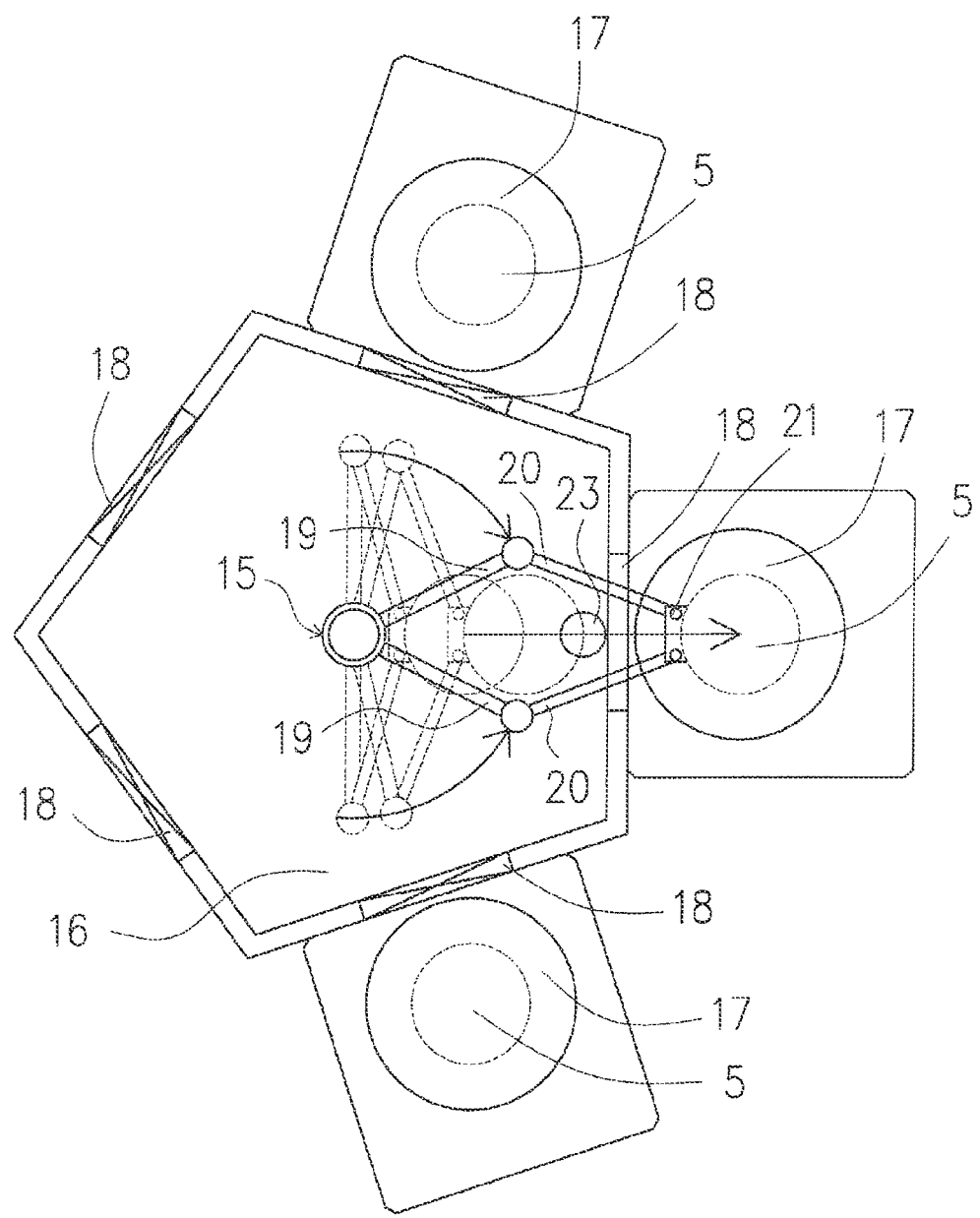
FIG. 3 is a top view showing a transport chamber 16 and a vacuum conveyance robot in this embodiment.
Figure 4:
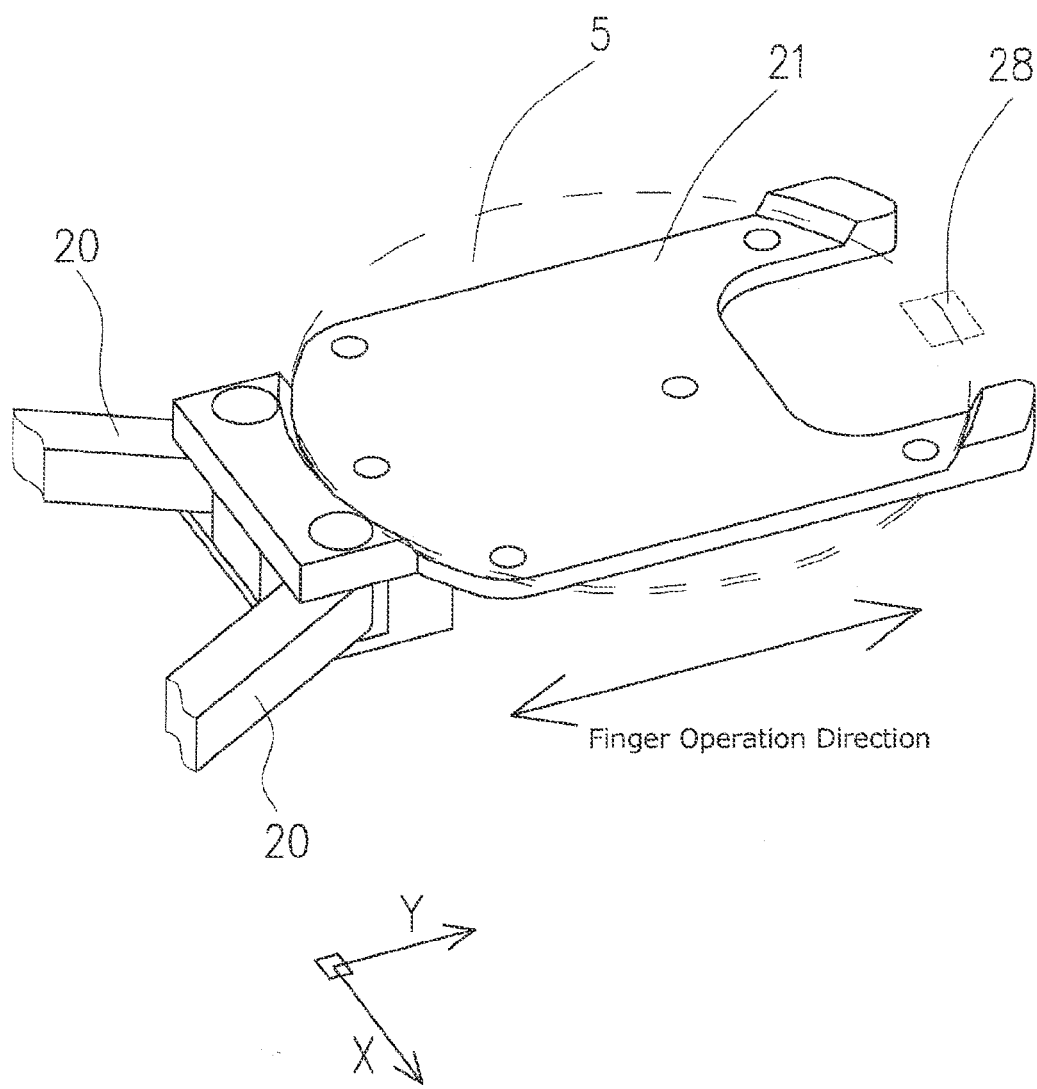
FIG. 4 is a view showing a finger of a supporting member in this embodiment.

In the processing device 3 of the present embodiment, the transport chamber 16 has a pentagon shape in a top surface view, and the vacuum conveyance robot 15 is located in the center portion of the transport chamber 16. The vacuum conveyance robot 15 is what is called a flog-leg type robot as illustrated in FIG. 3, has two first arms 19 each having the same length and the second arms 20 each having a base edge rotatably connected to the tip of each first arm 19, and fingers 21 for respectively supporting the semiconductor wafer 5 on the tips of the second arms 20. The base edge parts of the first arms 19 are fitted on the center of the transport chamber 16 so as to be stacked concentrically and rotatably, and the first arms 19 are respectively connected to unillustrated motors of a drive source through belts and pulleys. According to this structure, the vacuum conveyance robot 15 is capable of reciprocating the fingers 21 of a supporting member of the semiconductor wafer 5 radially around a pivot as the center and linearly by rotating each motor in the opposite direction. Further, the vacuum conveyance robot 15 is capable of rotating by rotating the motors in the same direction. Besides, each motor of a driving source is constructed so as to repeatedly move the finger 21 to the predetermined position by using a stepping motor or a servo motor controlling rotation angle.

A robot controlling section 35 for controlling motions of the vacuum conveyance robot 15 is provided with a teaching information storage means 40 for storing preliminarily indicated transporting position data and motion speed data concerning the vacuum conveyance robot 15 thereinside, and sends a control command so that the vacuum conveyance robot 15 accesses to the teaching position by the motion command from a host computer.

The finger 21 has a surface for supporting the semiconductor wafer 5. The surface is formed in an ark-shaped recess larger than the radius of the semiconductor wafer 5 by two to three millimeters hollowed from the periphery part to prevent the semiconductor wafer 5 from falling due to vibration or a centrifugal force during transporting. The recess has sides formed to incline spreading from the mounting surface of the semiconductor wafer 5 toward the upper surface so that the semiconductor wafer 5 is mounted on the finger 21 even though the semiconductor wafer 5 is slightly out of position during transporting. According to this inclination, the lifted semiconductor wafer 5 is automatically guided on the mounting surface of the finger 21. The tip of the finger 21 has an area larger than a visual field 28 of an image camera 24 cut off so as not to shield light from a transmitted illumination device 27 to capture the semiconductor wafer 5.

Amounting table 22 for mounting the semiconductor wafer 5 in the processing chamber 17 and the load-lock chamber 6 is located at a position where an arm body of the vacuum conveyance robot 15 can be reached by the extension action. The mounting table 22 is provided with a freely elevating and lowering lifter, so that the semiconductor wafer 5 mounted on the finger can be delivered by the lifting action of the lifter.

According to the above-mentioned setup, it is possible to bring the semiconductor wafer 5 stored in the FOUP 4 out and to deliver it to the vacuum conveyance robot 15 mounted in the processing device 3 through the load-lock chamber 6 after a proper positioning and notch positioning are performed by the aligner 10. Thereafter, the semiconductor wafer 5 received to the vacuum conveyance robot 15 comes to be transported on the mounting table 22 of the target processing chamber 17. However, in this case, a serious problem is occurred. That is, the semiconductor wafer 5 is influenced by vibrations or gas pressure change while being transported by the vacuum conveyance robot 15, thereby causing a fine positional misalignment laterally slipping on the finger 21.

Therefore, in the semiconductor manufacturing system 1 of the present invention, a view port 23 is provided to observe the inside of the transport chamber 16, the peripheral edge portion of the semiconductor wafer 5 is captured from the outside of the transport chamber 16 through the view port 23 by one image camera 24, and the position of the semiconductor wafer 5 is detected. The image camera 24 does not need to capture the peripheral edge portion over the entire periphery of the semiconductor wafer 5 but merely captures a part of it. Further, the image camera 24 dose not also need to be put on a special mounting table to detect a position.

Figure 5:
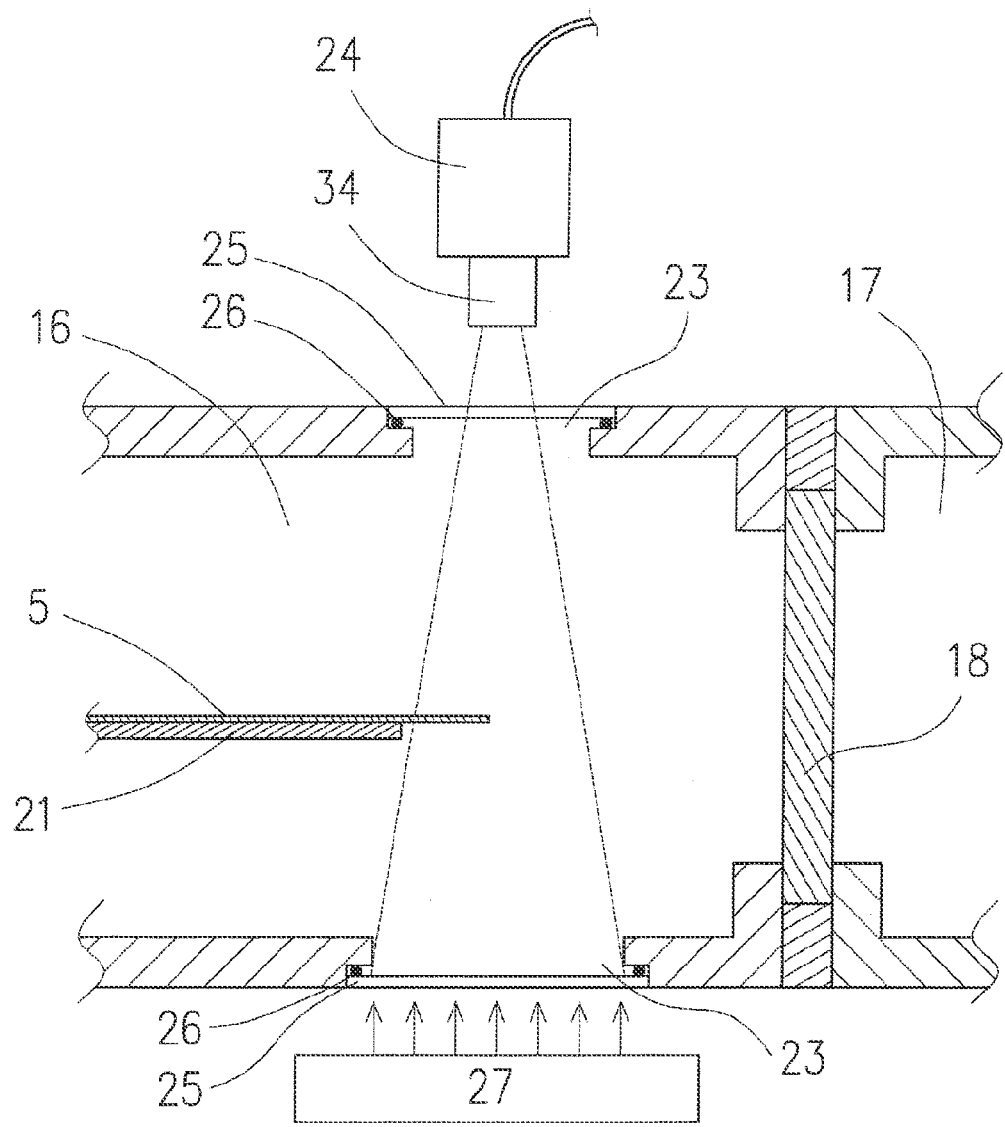
FIG. 5 is a view for explaining a position detection of a semiconductor wafer in this embodiment.

A process for detecting the center position of the semiconductor wafer 5, in which one image camera 24 is used, will be described below. FIG. 5 is a view for explaining a position detection of the semiconductor wafer 5 in the transport chamber 16. The image camera 24 is fixed on a member for forming the transport chamber 16 through fixing tools such as brackets. The view port 23 for observing the inside is provided above members forming the transport chamber 16, and a transparent light transmitting member 25 such as quartz glass is air-tightly fitted on the view port 23 through a seal material. Another view port 23 is provided below the transport chamber 16 being opposed to the above-mentioned view port 23. The lower view port 23 has the transmitted illumination device 27 provided so as to shine the peripheral edge portion of the semiconductor wafer 5 reaching the monitoring position from below. Besides, the transmitted illumination device 27 used in the present embodiment preferably has an illumination range larger than the vision of the image camera 24.

The transmitted illumination device 27 is usually provided with a fluorescent lamp, LED, a halogen lamp as a light source. In addition, the transmitted illumination device 27 is provided with reflex systems or a lens to prevent the generation of unevenness in brightness within the vision of the image camera 24. The reflex systems reflect the light irradiated from the light source to the side of the semiconductor wafer 5 of an inspection object, and the lens transforms it to parallel light in a direction orthogonal to the semiconductor wafer 5. Further, it is also preferable that making the light from the light source in parallel light by using a collimator lens in performing a fine position detection.

Figure 6:
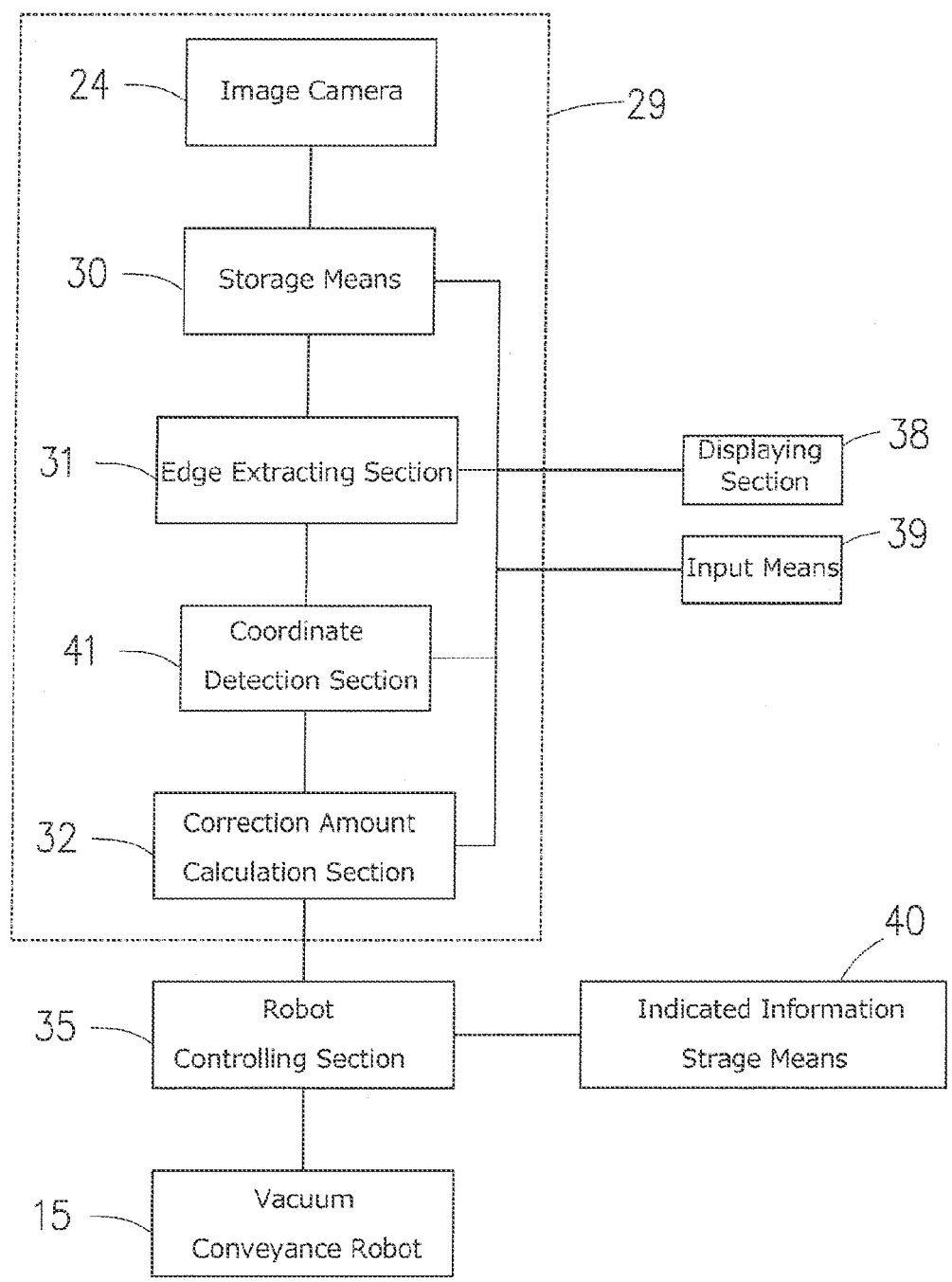
FIG. 6 is a block view showing a configuration of a position detecting device in the present invention.

Next, the position detecting device 29 will be described. FIG. 6 is a block view showing a configuration of the position detecting device 29. The position detecting device 29 includes the image camera 24 for capturing the peripheral edge portion of the semiconductor wafer 5, a storage means 30 for storing image data captured by the image camera 24, an edge extracting section 31 for extracting an edge of the peripheral edge portion from the image data, and a correction amount calculation section 32 for calculating the correction amount for the position data of the vacuum conveyance robot 15 from the data obtained by the edge extracting section 31. Further, a displaying section 38 for displaying data information to be processed by the position detecting device 29 such as an image captured by the image camera 24 and edge data extracted by the edge extracting section 31, and an input means 39 for performing input of various commands by hand and storage operation of the image to the position detecting device 29 can be connected to the position detecting device 29. Specifically, the displaying section 38 refers to a monitoring device having a display unit such as a liquid crystal, an organic EL and a CRT, and the input means 39 refers to a keyboard, a mouse, a touch panel and so on.

The image camera 24 includes at least image elements 33 and an optical lens 34 for receiving transmitted light from the transmitted illumination device 27 to form an image thereon, being placed on an upper portion of the transport chamber 16 so as to be located on a moving locus of the semiconductor wafer 5 mounted on the finger 21 of the vacuum conveyance robot 15. The image elements 33 are composed of semiconductor elements such as CCD (Charge Coupled Device) and CMOS (Complementary Metal Oxide Semiconductor), and transmit the image formed by the optical lens 34 to the storage means 30 as signal data of each element of the image elements 33. The signal data from the image elements 33 refer to output signals of each cell of the image elements 33, being transmitted in association with the coordinates installed on the incident surfaces of the image elements 33.

The storage means 30 stores image data transmitted from the image camera 24, coordinate data of the edge extracted by the edge extracting section 31 described below, and correction data of each semiconductor wafer 5 calculated by the correction amount calculation section 32. Further, the storage means 30 transmits required data to the edge extracting section 31 in accordance with requirements from the edge extracting section 31.

The edge extracting section 31 performs an edge extracting process of the semiconductor wafer 5 by executing an image processing program after reading the image data transmitted from the image camera 24. The image data for performing the edge extracting process has a difference of brightness and darkness on the image elements 33 from the difference in strength and weakness of the light between a portion where light from the transmitted illumination device 27 enters the image elements 33 without change and a portion where the light enters as a shadow by being shielded by the semiconductor wafer 5 in the view field 28 of the image camera 24. Accordingly, the coordinate data corresponding to the edge of the semiconductor wafer 5 can be extracted by extracting a portion where the difference of brightness and darkness is suddenly changed among the image data captured on the image elements 33. Here, the extracted image data are transmitted and stored to a coordinate detection section 41 and the storage means 30.

The coordinate detection section 41 detects coordinates on the edge and coordinates of the center position by the following method, based on the edge data extracted by the edge extracting section 31. Thus detected coordinate data and misalignment amount data are transmitted to the correction amount calculation section 32. The correction amount calculation section 32 calculates a misalignment amount of the target semiconductor wafer 5, and adds a correction date for moving the finger 21 in a direction for negating the misalignment from the calculated misalignment amount on the preliminarily indicated transporting position data, and thereafter transmits the correction date to the robot controlling section 35 so as to operate the vacuum conveyance robot 15. The robot controlling section 35 performs correction as new transporting position data by adding the correction data received from the correction amount calculation section 32 on the transporting position data stored in the indicated information storage means 40, and makes the vacuum conveyance robot 15 operate up to the corrected position.

Figure 7:
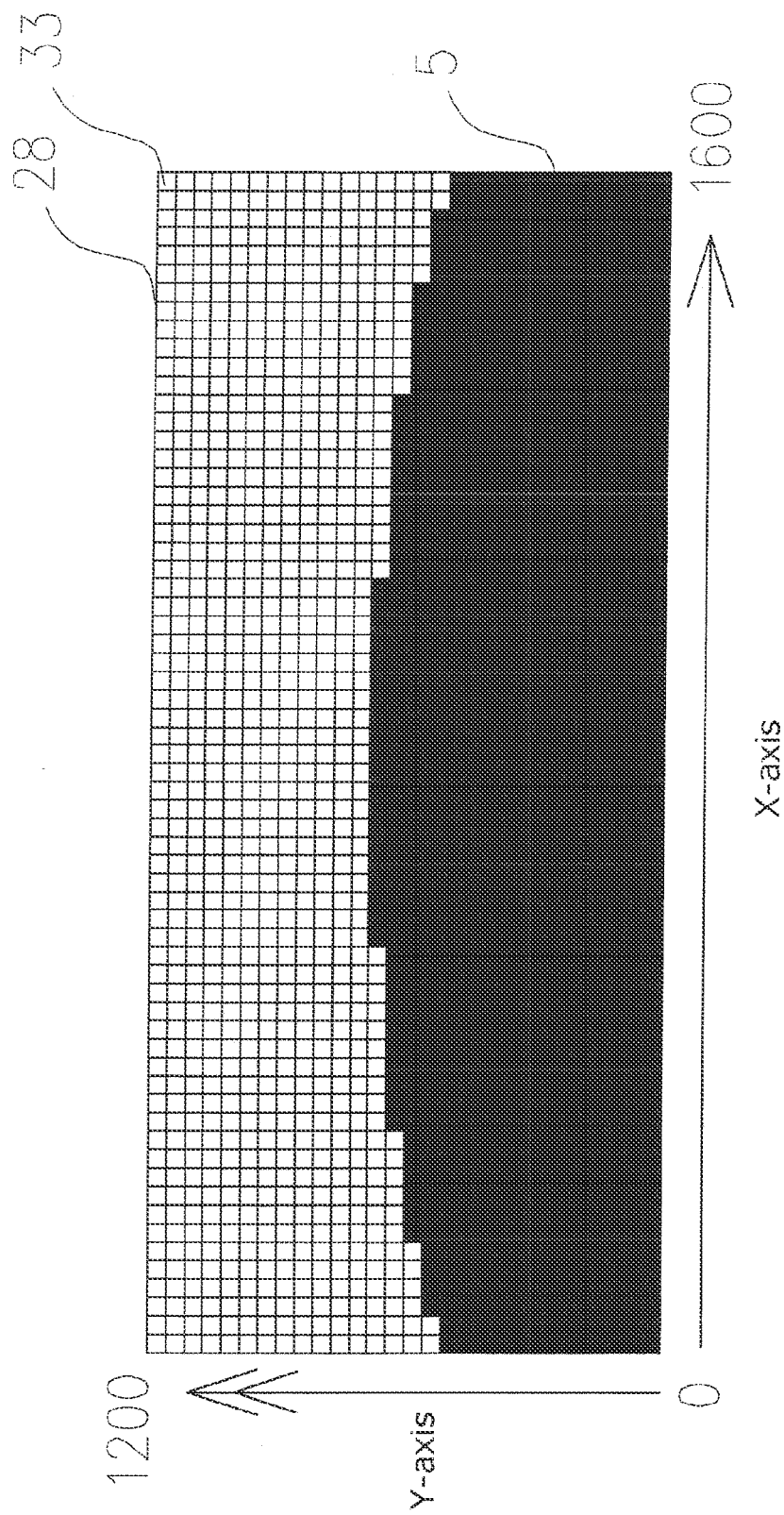
FIG. 7 is a view showing near a top of the semiconductor wafer captured by an image camera in this embodiment.

Next, a position detecting method of the semiconductor wafer 5 through the image camera 24 will be described below. FIG. 7 is a peripheral edge portion view captured by the image camera 24 in this embodiment. In the image camera 24, a lateral row of each cell forming the image elements 33 in FIG. 7 is defined as an X-axis, a vertical row perpendicular to the X-axis is defined as a Y-axis, and individual XY coordinates are allocated to each cell of the image elements 33. The visual field 28, which captures the semiconductor wafer 5, of the image camera 24 is formed in a size which the length in the X-axis direction is 64 mm and the length in the Y-axis direction is 48 mm. In converting these into a dot number which is the smallest unit of the cell, there are located cells of 1600 dots in the X-axis direction and 1200 dots in the Y-axis direction. That is, the edge of the peripheral edge portion and the center position of the semiconductor wafer 5 can be respectively extracted and detected by 4 micrometer order which is a size of one dot.

Further, in this embodiment, the semiconductor wafer 5 is mounted on the finger 21 and reciprocated to the destination position located on the upper of FIG. 7 along the path parallel to the Y-axis from the lower to the upper. Here, on the image elements 33, in order to detect the top in a direction of movement of the semiconductor wafer 5, namely, coordinates of the place closest to the destination position, the XY coordinates of the top are detected by comparing each gradation of the image in adjacent cells gray level 5. As for the Y-axis coordinates, it is easy to identify unit elements adjoining in the vertical direction because the difference of the gradation of the unit elements is clear. However, as for the X-axis coordinates, it is very difficult to identify the difference of the gradation between unit elements adjoining in the lateral direction.

FIG. 7 roughly illustrates a relationship between each dot near the top of the semiconductor wafer 5 and the edge of the semiconductor wafer 5. However, difference is hard to be produced in the gradation between the adjacent cells because each of the cells aligned in the X-axis direction is located along a tangential line tangential to the target edge on the peripheral edge portion of the semiconductor wafer. That is, the degree of the gradation becomes nearly equal in the adjacent cells, the position cannot be detected by cell units, and therefore, as for the X-axial detecting position, the coordinates of a long and narrow line parallel to the X-axis direction are detected as the top.

Therefore, the following method accurately detects an amount of the positional misalignment in the X-axis direction or the Y-axis direction of the semiconductor wafer 5 during conveyance. FIG. 8 to FIG. 11 are explanatory views for giving an outline of detection of the positional misalignment amount of the semiconductor wafer 5, respectively.

First, the semiconductor wafer 5 mounted with no positional misalignments at a reference position, where serves as a reference in performing a positional misalignment detecting process, is captured. The semiconductor wafer 5 of the reference is mounted at an architectonic proper position of the finger 21 of the vacuum conveyance robot 15 by using jigs and so on. Thereafter, the vacuum conveyance robot 15 is operated and moved to a monitoring position so that the tip portion of the moving locus of the semiconductor wafer 5 should be positioned within the visual field 28 of the image camera 24. When the vacuum conveyance robot 15 reaches the predetermined monitoring position, the movement of the vacuum conveyance robot 15 is temporarily stopped and the peripheral edge portion of the semiconductor wafer 5 is captured. The captured image is transmitted and stored in the storage means 30 as a reference image data. Besides, the image data of the reference may be made by using a jig having the same arc with the semiconductor wafer 5 instead of the real semiconductor wafer 5. Besides, in this embodiment, although the movement of the vacuum conveyance robot 15 is temporarily stopped at the time of capturing, the semiconductor wafer 5 under moving may be captured by the vacuum conveyance robot 15 for the purpose of enhancing throughput.

Here, the image date is transmitted to the edge extracting section 31, and the edge of the peripheral edge portion is extracted. Next, the coordinate detecting section 41 obtains center coordinates of a reference circle 36, which is the semiconductor wafer 5 mounted at the reference position, from the edge data obtained by the edge extracting section 31 and the known radius of the semiconductor wafer 5. Firstly, a Y coordinate value of the top on the circumference and two arbitrary places are selected from the edge data extracted by the edge extracting section 31, and then the center coordinates are obtained from the XY coordinate data of the two places and the radius of the semiconductor wafer 5.

(The First Method for Detecting an Amount of Positional Misalignment)

Figure 8:
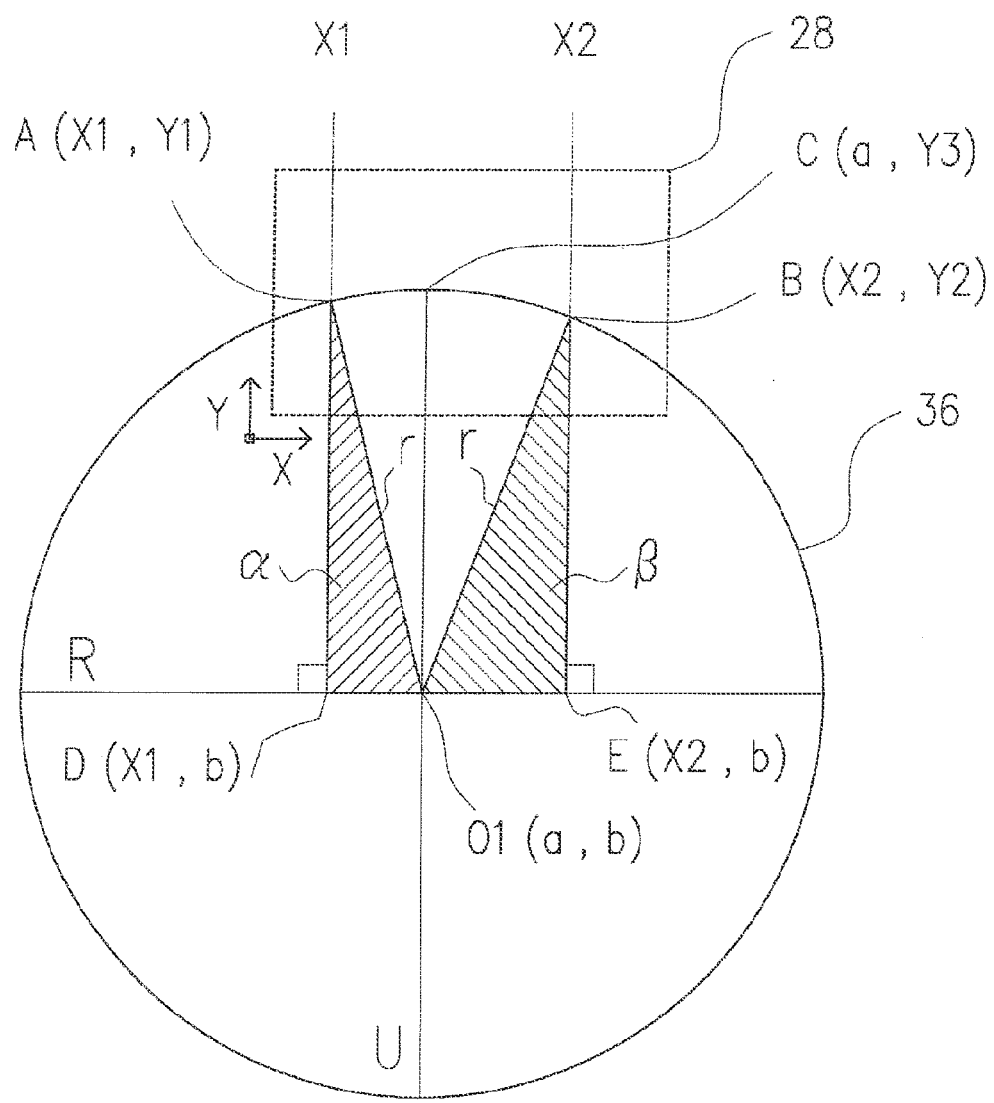
FIG. 8 is a view showing outline of the first and the second methods for detecting an amount of positional misalignment in the present invention.

FIG. 8 is an explanatory view showing a positional relationship between the reference circle 36 and the visual field 28. The reference circle 36 artificially shows the whole image of the semiconductor wafer 5 while detecting the position, the visual field 28 shows an imaging range captured by the image camera 24, and the origin is located at the left lower place of the visual field 28 in figures. First, two arbitrary places are designated on the edge extracted by the edge extracting process. The designated two places are denoted by places A and B, and the XY coordinates of the places A and B in the visual field 28 are respectively specified to (X1, Y1) and (X2, Y2). Next, straight lines X1 and X2 respectively passing through the places A, B are drawn parallel to the Y-axis of the visual field 28. In addition, the center of the reference circle 36 is denoted by O1, and the XY coordinates are specified to (a, b). Next, a straight line R passing through the center O1 of the reference circle 36 is drawn parallel to the X-axis of the visual field 28. The intersection of the straight line R and the straight line X1 is denoted by D, and the intersection of the straight line R and the straight line X2 is denoted by E. Here, the XY coordinates of the intersection D is positioned on (X1, b), and the XY coordinates of the intersection E is positioned on (X2, b). Therefore, two right-angled triangles α and β are formed on the reference circle 36, and the length dimensions of the sides A-01 and B-01 of these right-angled triangles α and β are equal with the radius r of the reference circle 36. Thus, in the right-angled triangle α, the formula: $(X1-a)^2 (Y1-b)^2=r^2$ . . . (1) is established, and in the right-angled triangle β, the formula: $(X2-a)^2+(Y2-b)^2=r^2$ . . . (2) is established.

Further, a straight line U passing through the center O1 of the reference circle 36 is drawn parallel to the Y-axis, and the intersection of the straight line U and the edge of the reference circle 36 in the visual field 28 is specified to a place C. The XY coordinates of the place C in the visual field 28 are specified to (a, Y3). Here, since the semiconductor wafer 5 as the reference circle 36 is mounted on the finger 21 and moves in parallel to the Y-axis, it can be said the place C is the nearest top to the destination. Although the Y coordinate Y3 can be detected by the position detecting device 29, the X coordinate (a) becomes an unknown value because an only unclear image is recognizable. Since the XY coordinate values X1 and Y1 of the place A and the XY coordinate values X2 and Y2 of the place B can be detected by the position detecting device 29, the Y coordinate b of the center O1 can be calculated by the formula: b=Y3−r . . . (3). Besides, the radius r is a default value because it is the radius of the semiconductor wafer 5 during conveyance.

Next, the method of calculation to find the X coordinate (a) of the center O1 will be described below. First, in case of the formula (1)—the formula (2), the formula: $(X1-a)^2-(X2-a)^2+(Y1-b)^2-(Y2-b)^2=0$ . . . (4) is established. In developing the formula (4), the formula: $X1^2-X2^2+Y1^2-Y2^2-2(X1-X2)a-2(Y1-Y2)b=0$ . . . (5) is established. In arranging the formula (5) into the calculation formula to find the value (a), the formula: $a=\{X1^2-X2^2+Y1^2-Y2^2-2(Y1-Y2)b\}/2(X1-X2)$ . . . (6) is established. As mentioned previously, since the values except the value (a) are the coordinate values which have been already detected, the X coordinate value (a) of the center O1 can be calculated from the above formula. The calculated coordinates (a, b) of the center O1 of the reference circle 36 are transmitted and stored to the storage means 30.

After detecting the reference circle 36, the position detecting device 29 extracts the edge of the semiconductor wafer 5, which is transported in actually manufacturing process, with defining the coordinates (a, b) of the center O1 as the reference position, and then, detects the amount of misalignment. In this case, the operation position of each motor to operate the finger 21 must be equal to the monitoring position for extracting the above-mentioned reference circle 36. A method for detecting the center positon of a measuring circle 37, which is extracted from the semiconductor wafer 5 being transported in the target manufacturing process, is performed according to the same procedures as the procedures shown in the previously mentioned formula (1) to formula (6).

Figure 9:
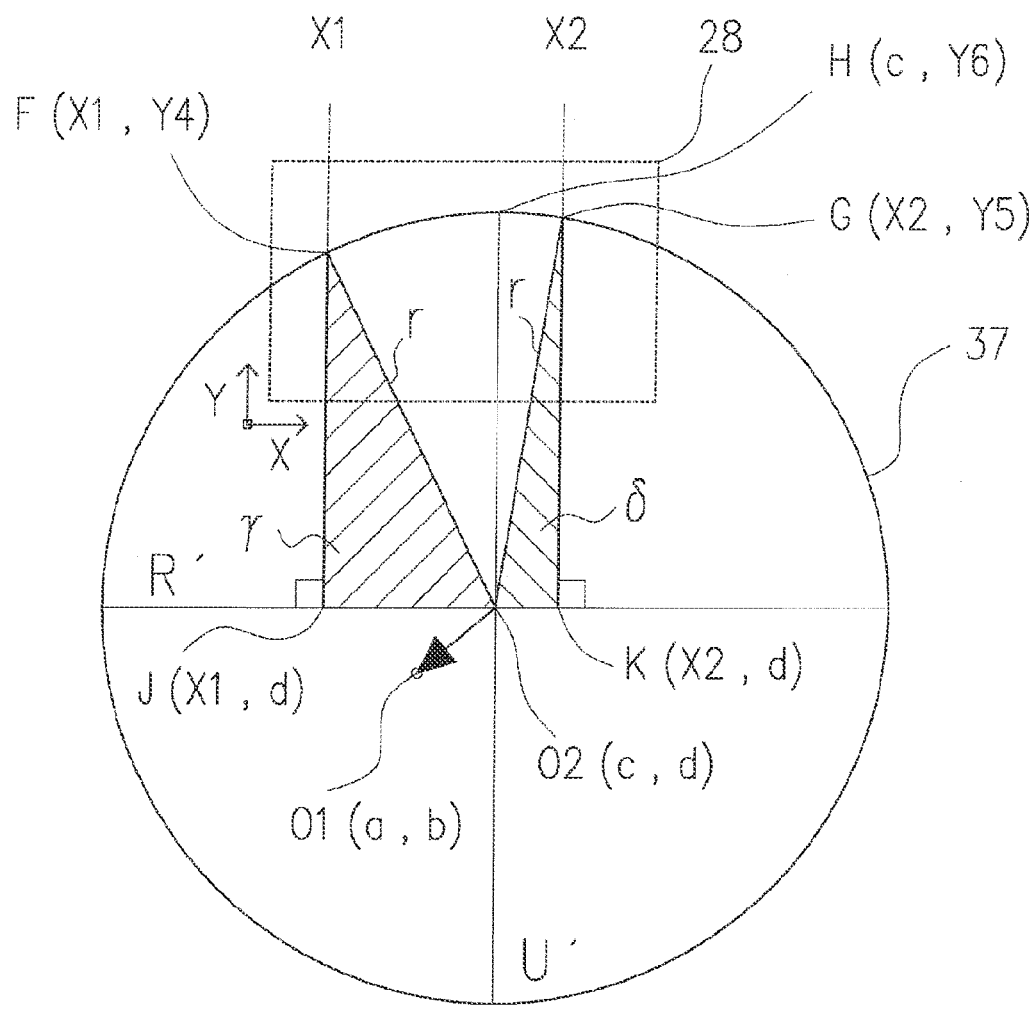
FIG. 9 is a view showing outline of the first and the second methods for detecting an amount of positional misalignment in the present invention.

FIG. 9 is an explanation view showing a positional relationship between the visual field 28 and the measuring circle 37 artificially illustrating the semiconductor wafer 5 being actually transported in the manufacturing process. The XY coordinates of the center O2 of the measuring circle 37 on the visual field 28 are specified to (c, d). Here, the intersections of the edge of the measuring circle 37 extracted by the edge extracting section 31 and the straight lines X1 and X2 are respectively specified places F and G, and the XY coordinates of the place F are specified to (X1, Y4) and the XY coordinates of the place G are specified to (X2, Y5). Next, a straight line R' passing through the center O2 is drawn parallel to the X-axis, and the intersection of the straight line R' and the straight line X1 is denoted by K and the intersection of the straight line R' and the straight line X2 is denoted by J. Here, the XY coordinates of the intersection J are positioned on (X1, d), and the XY coordinates of the intersection K are specified to (X2, d). Therefore, two right-angled triangles γ and δ are formed on the measuring circle 37. The length dimensions of the sides F-02 and G-02 of these right-angled triangles γ and δ are equal with the radius r of the measuring circle 37. Thus, in the right-angled triangle γ, the formula: $(X1-c)^2+(Y4-d)^2=r^2$ . . . (7) is established, and in the right-angled triangle δ, the formula: $(X2-c)^2+(Y5-d)^2=r^2$ . . . (8) is established.

Further, in the measuring circle 37 as well as the reference circle 36, the intersection of a straight line U' passing through the center O2 and parallel to the Y-axis and the edge of the measuring circle 37 in the visual field 28 is specified to a place H. The XY coordinates of the place H are specified to (c, Y6). Here, since the measuring circle 37 is also mounted on the finger 21 as well as the reference circle 36 and moves toward the upper part of the screen in parallel to the Y-axis, it can be said the place H is the nearest top to the destination. The Y coordinate Y6 of the place H can be detected by the position detecting device 29. However, the X coordinate c becomes an unknown value because an only unclear image is recognizable. Further, since the XY coordinate values X1 and Y4 of the place F and the XY coordinate values X2 and Y5 of the place G can be detected by the position detecting device 29, the Y coordinate d of the center O2 can be calculated by the formula: d=Y6−r . . . (9). Besides, the radius r is a default value because it is the radius of the semiconductor wafer 5 during conveyance.

Next, the method of calculation to find the X-coordinate c of the center O2 will be described below. In case of the formula (7) the formula (8), the formula: $(X1-c)^2-(X2-c)^2+(Y4-d)^2-(Y5-d)^2=0$ (10) is established. In developing the formula (10), the formula: $X1^2-X2^2+Y4^2-Y5^2-2(X1-X2)$ c−2(Y4−Y5)d=0 . . . (11) is established. In arranging the formula (11) into the calculation formula to find the value c, the formula: c={X1²−X2²+Y4²−Y5²−2(Y4−Y5)d}/2(X1−X2) . . . (12) is established. Since the values except the value c are the coordinate values which have been already detected, the X coordinate value c of the center O2 can be calculated from the above-mentioned formula. The calculated coordinates (c, d) of the center O2 of the measuring circle 37 are transmitted and stored to the storage means 30.

The correction amount calculation section 32 converts numerically how far the calculated coordinates (c, d) of the center is off to the X-axis direction and the Y-axis direction on the XY coordinates in contrast with the coordinates (a, b) of the center O1 of the reference circle 36. The correction amount calculation section 32, based on the numerical misalignment amount, determines a correction amount for a rotation angle of each driving motor of a driving source so as to operate the finger 21 of the vacuum conveyance robot 12 in a direction for negating the positional misalignment. The robot controlling section 35 receives the correction data concerning the rotation angle of the driving motor, and operates the vacuum conveyance robot 15 according to the correction data.

This is an explanation of the first method for calculating the correction amount. It should be noted that cutout portions such as a notch and orientation flat are formed on the semiconductor wafer 5 for positioning. As mentioned previously, as for the semiconductor wafer 5 stored in the FOUP 4 and transported from the previous process, the aligner 10 provided in the EFEM 2 applies alignment processing to the notch and the orientation flat. This alignment processing is processed so that notches or orientation flats of all the semiconductor wafers 5 are directed in the same direction. Therefore, the image camera 24 has only to be installed so that the visual field 28 can be set up on the semiconductor wafer 5 without no notches and orientation flats. Otherwise, since the notch can be extracted from the image of the image camera 24 even though the notch exists in the visual field 28, the place on the edge should be determined to a position without the orientation flat.

(The Second Method for Detecting an Amount of Positional Misalignment)

In the previously mentioned first method, the X coordinates (a) and c of the centers O1 and O2 were respectively calculated by using the Y coordinate Y3 of the top C of the semiconductor wafer 5 on the reference position (the reference circle 36) and the Y coordinate Y6 of the top H of the semiconductor wafer 5 being actually transported on the production line (the measuring circle 37). A method for calculating the X coordinates (a) and c of the centers O1 and O2 will be explained without using the Y coordinates of the tops C and H as following. Here, FIG. 8 and FIG. 9 will be used as well as the first method for calculating the correction amount.

First, in arranging the previously mentioned formula (5) referring to the reference circle 36 into a formula for finding the Y coordinate b of the center O1, the formula b={−2(X1−X2)a+X1²−X2²+Y1²−Y2²}/2(Y1−Y2) . . . (13) is established. Besides, in arranging the previously mentioned formula (11) referring to the measuring circle 37 into a formula for finding the Y coordinate d of the center O2, the formula: d={−2(X1−X2)c+X1²−X2²+Y4²−Y5²}/2(Y4−Y5) . . . (14) is established. Here, in substituting the formula (13) in the formula (1) and developing it, the following formula (15) is established.

[Numerical formula 1]

$$b=\{-2(X1-X2)a+X1^2-X2^2+Y1^2-Y2^2\}/2(Y1-Y2) \qquad (13)$$

Here, to simplify the formula, b=A·a+B is specified.

$$A = \frac{-(X1-X2)}{(Y1-Y2)}$$

$$B = \frac{X1^2 - X2^2 + Y1^2 - Y2^2}{2(Y1-Y2)}$$

In substituting these in the formula (1);

$$X1^2 - 2X1 \cdot a + a^2 + Y1^2 - 2Y1(A \cdot a + B) + (A \cdot a + B)^2 = r^2$$

↓

$$X1^2 - 2X1 \cdot a + a^2 + Y1^2 - 2Y1 \cdot A \cdot a - 2Y1 \cdot B + A^2 \cdot a^2 + 2A \cdot B \cdot a + B^2 - r^2 = 0$$

↓

$$A^2 \cdot a^2 + a^2 - 2X1 \cdot a - 2Y1 \cdot A \cdot a + 2A \cdot B \cdot a + X1^2 + Y1^2 - 2Y1 \cdot B + B^2 - r^2 = 0$$

↓

$$(A^2+1)a^2 - 2(X1+Y1 \cdot A - A \cdot B)a + X1^2 + (Y1-B)^2 - r^2 = 0$$

↓ according to formula of solution $$a = (X1+Y1 \cdot A - A \cdot B) \pm \frac{\sqrt{\{(X1+Y1 \cdot A - A \cdot B)^2 - (A^2+1)\{X1^2+(Y1-B)^2-r^2\}\}}}{(A^2+1)} \qquad (15)$$

Next, in substituting the formula (14) in the formula (7) and developing it, the following formula (16) is established.

[Numerical formula 2]

$$d=\{-2(X1-X2)c+X1^2-X2^2+Y4^2-Y5^2\}/2(Y4-Y5) \qquad (14)$$

Here, to simplify the formula, d=A·c+B is specified.

$$A = \frac{-(X1-X2)}{(Y4-Y5)}$$

$$B = \frac{X1^2 - X2^2 + Y4^2 - Y5^2}{2(Y4-Y5)}$$

In substituting these in the formula (7);

$$X1^2 - 2X1 \cdot c + c^2 + Y4^2 - 2Y4(A \cdot c + B) + (A \cdot c + B)^2 = r^2$$

↓

$$X1^2 - 2X1 \cdot c + c^2 + Y4^2 - 2Y4 \cdot A \cdot c - 2Y4 \cdot B + A^2 \cdot c^2 + 2A \cdot B \cdot c + B^2 - r^2 = 0$$

↓

$$A^2 \cdot c^2 + c^2 - 2X1 \cdot c - 2Y4 \cdot A \cdot c + 2A \cdot B \cdot c + X1^2 + Y4^2 - 2Y4 \cdot B + B^2 - r^2 = 0$$

↓

$$(A^2+1)c^2 - 2(X1+Y4 \cdot A - A \cdot B)c + X1^2 + (Y4-B)^2 - r^2 = 0$$

↓ according to formula of solution $$c = (X1 + Y4 \cdot A - A \cdot B) \pm \frac{\sqrt{(X1 + Ya \cdot A - A \cdot B)^2 - (A^2 + 1)\{X1^2 + (Y4 - B)^2 - r^2\}}}{(A^2 + 1)} \quad (16)$$

Using the above mentioned formulas (15) and (16), the X coordinates (a) and c of the centers O1 and O2 of the reference circle 36 and the measuring circle 37 can be respectively calculated from the XY coordinates of the places A, B, F and G on the edge. Besides, values calculated from the formulas (15) and (16) have respectively square roots. Whether a positive or negative numerical value is used will depend on the scale of the values Y1 and Y2. That is, the position of the regular center can be calculated by using the positive value in case the value Y1 is smaller than the value Y2, and by using the negative value in case the value Y1 is larger than the value Y2. Besides, in case the values Y1 and Y2 are the same, the straight line X1 or X2 is preferably reestablished. Here, since the Y coordinates b and d of the centers O1 and O2 can be respectively calculated according to the above mentioned formulas (13) and (14), the coordinates of the centers O1 and O2 can be found. Next, the misalignment amount on the XY coordinates of the measuring circle 37 to the reference circle 36 is calculated. The procedures for correcting the operation of the vacuum conveyance robot 15 from the misalignment amount are as previously mentioned, and therefore, the explanation will be omitted here.

Figure 10:
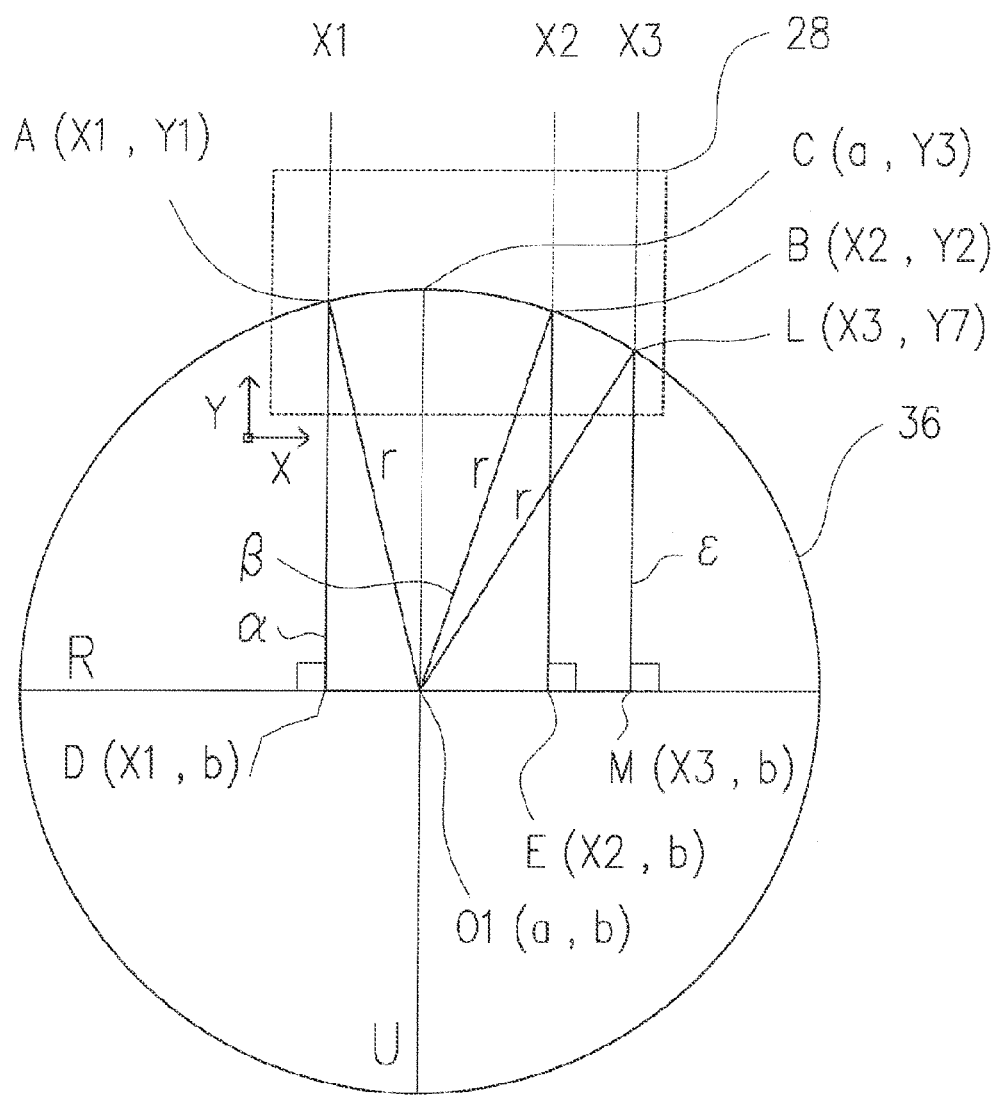
FIG. 10 is a view showing outline of the third method for detecting an amount of positional misalignment in the present invention.
Figure 11:
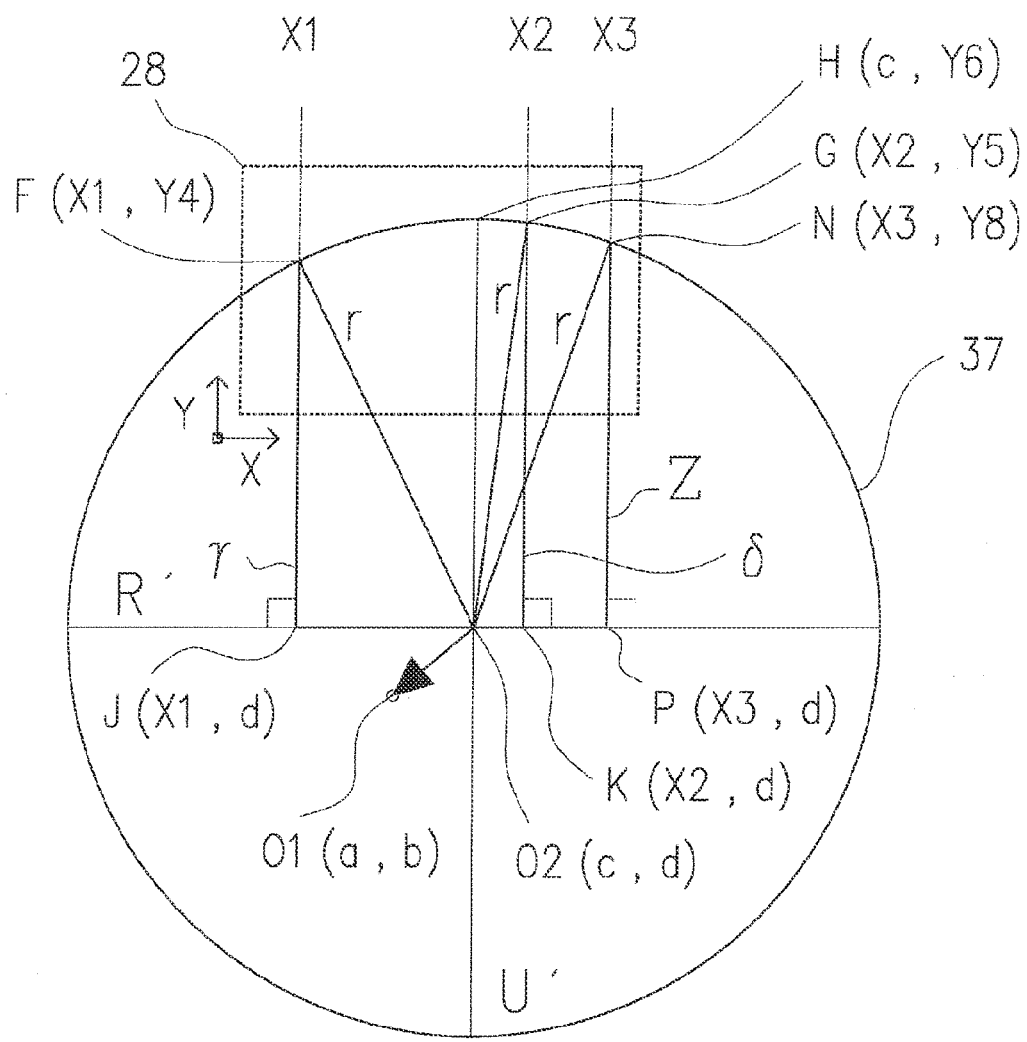
FIG. 11 is a view showing outline of the third method for detecting an amount of positional misalignment in the present invention.

In the above-mentioned two calculation methods, the radius r of the semiconductor wafer 5 has been inputted as a known value. A calculation method having no need of the value of the radius r will be explained as follows. According to this calculation method, even if there occur dispersions in the radius dimension of the transporting semiconductor wafer 5, the position of the center and the correction amount can be calculated accurately. FIG. 10 and FIG. 11 respectively explain the outline of the third correction amount calculation method. Although two places are optionally extracted on the edge by the edge extraction processing in the first and the second correction amount calculation methods, any places L and N are designated on the edge as the third place in addition to the two places.

(The Third Method for Detecting an Amount of Positional Misalignment)

The third positional misalignment amount detection method will be concretely explained below. A method for finding the radius r and the XY coordinates (a, b) of the center O1 of the reference circle 36 will be firstly explained with reference to FIG. 10. The third place is optionally designated on the edge extracted from the image of the semiconductor wafer 5 placed on the reference position in addition to the previously designated places A and B. The designated third place is denoted by a place L, and the XY coordinates of the place L are specified to (X3, Y7) in the visual field 28. Besides, the XY coordinates of the previously designated places A and B are respectively specified to (X1, Y1) and (X2, Y2) in the visual field 28. Next, straight lines X1, X2 and X3 parallel to the Y-axis of the visual field 28 are respectively drawn so as to pass through the places A, B and L. The center of the reference circle 36 is denoted by O1 and the XY coordinates are specified to (a, b) as well as the mentioned above.

Next, just like the above-mentioned explanation, the XY coordinates of the intersection D of the straight line R and the straight line X1 is specified to (X1, b), the XY coordinates of the intersection E of the straight line R and the straight line X2 is specified to (X2, b), and the XY coordinates of the intersection M of the straight line R and the straight line X3 is specified to (X3, b). Therefore, three right-angled triangles α, δ and ε e are formed on the reference circle 36, and the length of the side L-01 of the right-angled triangle ε is also equal with the radius r of the reference circle 36. Thus, the formula (1) is established to the right-angled triangle α, the formula (2) is established to the right-angled triangle β, and the formula: $(X3-a)^2+(Y7-b)^2=r^2$ ... (17) is established to the right-angled triangle ε.

Here, the formula (5) is established by extracting the formula (2) from the formula (1) with using relational expressions of the right-angled triangles α and β. The formula (18): $X1^2-X3^2+Y1^2-Y7^2-2(X1-X3)a-2(Y1-Y7)b=0$ ... (18) is established by extracting the formula (17) from the formula (1) with using relational expressions of the right-angled triangles α and β. Here, the formulas (19) and (20) are respectively established by arranging the formulas (5) and (18) in linear equations for finding (a) and b, and the XY coordinates (a, b) of the center O1 can be found. Besides, the radius r of the reference circle 36 can be found from, for example, the formula (17) by finding the XY coordinates (a, b).

[Numerical Formula 3]

Algebras are defined as follows to find the values (a) and b from the formulas (5) and (18);

$A=2(X1-X2)$ $B=X1^2+X2^2+Y1^2-Y2^2$ $C=2(Y1-Y2)$ $D=2(X1-X3)$ $E=X1^2+X3^2+Y1^2-Y7^2$ $F=2(Y1-Y7)$

The formula (5) is established to $B-A \cdot a-C \cdot b=0$. It can be deformed to: $a=(B-C \cdot b)/A$ or $b=(B-A \cdot a)/C$.

The formula (18) is established to $E-D \cdot a-F \cdot b=0$. It can be deformed to: $a=E-F \cdot b/D$ or $b=(E-D \cdot a)/F$.

The values (a) and b are found from the above-mentioned formulas as follows;

$$a = \frac{CE - FB}{CD - FA}, \quad b = \frac{AE - DB}{AF - DC}$$

The algebras are originally restored;

$a=\{2(Y1-Y2)(X1^2-X3^2+Y1^2-Y7^2)-2(Y1-Y7)(X1^2-X2^2+Y1^2-Y2^2)\}/\{2(Y1-Y2) \cdot 2(X1-X3)-2(X1-X2) \cdot 2(Y1-Y7)\}$ (19)

$b=\{2(X1-X2)(X1^2-X3^2+Y1^2-Y7^2)-2(X1+X3)(X1^2-X2^2+Y1^2-Y2^2)\}/\{2(X1-X2) \cdot 2(Y1-Y7)-2(Y1-Y2) \cdot 2(X1-X3)\}$ (20)

Next, a calculation formula for finding the XY coordinates (c, d) of the center O2 of the calculating circle 37 is prepared with reference to FIG. 11. FIG. 11 is an explanatory view having the third straight line X3 in addition to FIG. 9. Like the reference circle 36 shown in FIG. 10, a place N denotes intersection of the third straight line X3 and the edge of the calculating circle 37, and the XY coordinates of the place N are specified to (X3, Y8). Next, in specifying the intersections of the straight lines X1, X2, X3 and the straight line R' parallel to the X-axis of the view field 28 passing through the center O2 of the calculating circle 37 to J, K, P, respectively, the XY coordinates of the intersections J, K, P are specified to (X1, d), (X2, d), (X3, d), respectively. Therefore, three right-angled triangles γ, δ and Z are formed on the calculating circle 37, and the length of the side N-02 of the right-angled triangle Z is also equal with the radius r of the calculating circle 37. Thus, the formula (7) is established to the right-angled triangle γ, the formula (8) is established to the right-angled triangle δ, and the formula: $(X3-c)^2+(Y8-d)^2=r^2$ ... (21) is established to the right-angled triangle Z.

Here, from the above-mentioned formulas, the formula (22) is established by extracting the formula (8) from the formula (7), and the formula (23) is established by extracting the formula (21) from the formula (8).

$$X1^2-X2^2+Y4^2-Y5^2-2(X1-X2)c-2(Y4-Y5)d=0 \quad (22)$$

$$X2^2-X3^2+Y5^2-Y8^2-2(X2-X3)c-2(Y5-Y8)d=0 \quad (23)$$

Here, the formula (24) and the formula (25) are established by performing calculations like the previously stated reference circle 36, and the XY coordinates (c, d) of the center O2 of the calculating circle 37 can be found. Besides, the radius r of the calculating circle 37 can be found from, for example, the formula (21) by finding the XY coordinates (c, d).

[Numerical formula 4]

$$c=\{2(Y4-Y5)(X1^2-X3^2+Y4^2-Y8^2)-2(Y4-Y8)(X1^2-X3^2+Y4^2-Y5^2)\}/\{2(Y4-Y5)\cdot 2(X1-X3)-2(X1-X2)\cdot 2(Y4-Y8)\} \quad (24)$$

[Numerical formula 5]

$$d=\{2(X1-X2)(X1^2-X3^2+Y4^2-Y8^2)-2(X1-X3)(X1^2-X2^2+Y4^2-Y5^2)\}/\{2(X1-X2)\cdot 2(Y4-Y8)-2(Y4-Y5)\cdot 2(X1-X3)\} \quad (25)$$

As for positional misalignment amounts Ax and Ay in the X-axis direction and the Y-axis direction of the semiconductor wafer 5 being transported on the manufacturing line, the amount Ax in the X-axis direction is found by subtracting the X coordinate (a) of the center of the reference circle 36 from the X coordinate c of the center of the calculating circle 37, and the amount Ay in the Y-axis direction is found by subtracting the Y coordinate b of the center of the reference circle 36 from the Y coordinate d of the center of the calculating circle 37. The correction amount calculation section 32, based on the positional misalignment amounts in the X-axis direction and the Y-axis direction, finds the correction amount for the rotation angle of each driving motor of a driving source so that the finger 21 of the vacant conveyance robot 15 can be corrected and operated in a direction for negating the positional misalignment. The robot controlling section 35 receiving the correction data concerning the rotation angle of the driving motor operates the vacuum conveyance robot 15 according to the correction data. Besides, since the third method for detecting an amount of positional misalignment enables to calculate a small difference in the radius of the semiconductor wafer 5, the correction amount can be calculated for a place which is determined on the circumference of the reference circle 36 as a reference position.

(The Fourth Method for Detecting an Amount of Positional Misalignment)

Figure 12:
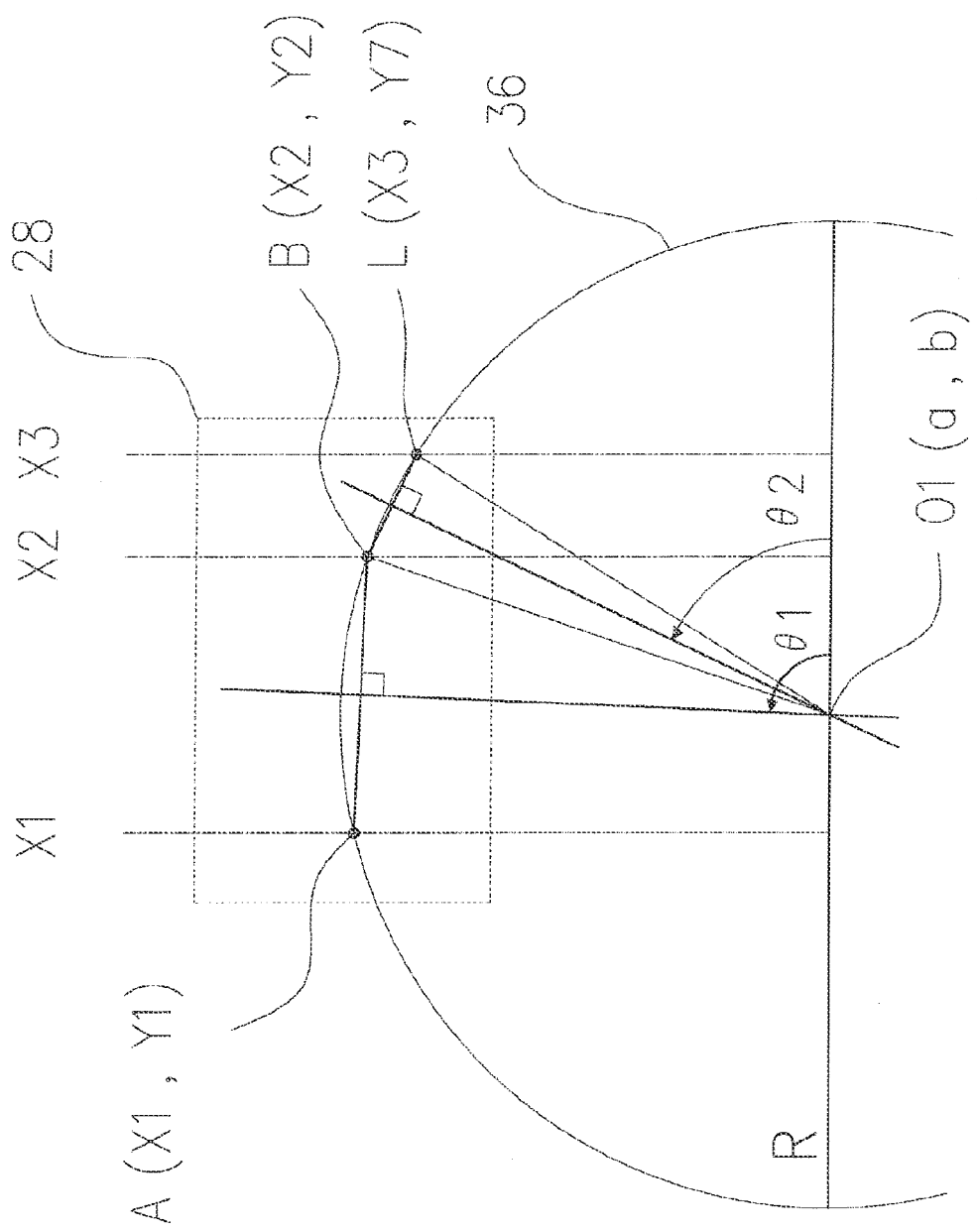
FIG. 12 is a view showing outline of the fourth method for detecting an amount of positional misalignment in the present invention.

There is a method for finding the center position of the circle from three places on the edge in the visual field 28 besides the previously stated methods, namely, two places are selected from three places on the circumference, two straight lines combining the above-mentioned two places are drawn, and the center position can be found by matching an intersection of perpendicular bisectors of the above-mentioned two straight lines with the center of the circle. FIG. 12 is an explanatory view showing perpendicular bisectors relating to straight lines respectively combining two places A and B, B and L which are selected from three places A, B and L on the reference circle 36. Besides, the same places and straight lines of the reference circle 36 and the calculating circle 37 are given the same reference characters. A perpendicular bisector of a straight line A-B combing the places A and B is denoted by S, and an intersection of the straight line A-B and the perpendicular bisector S is denoted by s. Besides, a perpendicular bisector of a straight line B-L combing the places B and L is denoted by T, and an intersection of the straight line B-L and the perpendicular bisector T is denoted by t. The tilt angles and the centers of the straight lines A-B and B-L are detected by the coordinate detection section 41. The tilt angles of the perpendicular bisectors S and T intersecting with the straight lines A-B and B-L can be also detected by detecting the slants of the straight lines A-B and B-L, respectively. Here, the intersection of the perpendicular bisectors S and T forms the center O1 of the reference circle 36.

Next, in specifying the coordinates of the places s and t to (X5, Y9) and (X6, Y10), and in specifying the angles from the straight line R parallel to the coordinate axis of the X direction passing through the center O1 to the straight lines S and T to $O_1$ and $O_2$, respectively: the formulas:

$$Y9-b=(X5-a)\tan\theta_1 \quad (26) \text{ and}$$

$$Y10-b=(X6-a)\tan\theta_2 \quad (27) \text{ are established,}$$

and in subtracting the formula (27) from the formula (26) to delete b, the formula:

$$Y9-Y10=X5\tan\theta_1-X6\tan\theta_2-a\tan\theta_1+a\tan\theta_2 \quad (28) \text{ is established.}$$

The X coordinate (a) of the center O1 is calculated by the following formula (29):

$$a=(Y9-Y10-X5\tan\theta_1+X6\tan\theta_2)/(\tan\theta_2-\tan\theta_1) \quad (29).$$

Besides, b can be found from, for example, the formula (26) by using the following formula (30):

$$b=Y9-(X5-a)\tan\theta_1 \quad (30).$$

Since the coordinates (a, b) of the center O1 are found, the radius r of the reference circle 36 can be found by any one of the formulas (1), (2) and (15).

The above is an explanation for the fourth positional misalignment amount detection method to find the center coordinates (a, b) of the reference circle 36. Since the center coordinates (c, d) and the radius r of the calculating circle 37 can be found by substituting the coordinates and the angles with using the previously stated method, the misalignment amount can be found easily. Besides, it goes without saying that there are known calculation methods such as a calculation method using a matrix except for the above-mentioned method as a method for finding the center position from three places on the circumference.

In some cases, it is thought that the notch formed on the semiconductor wafer 5 may be positioned on one of the previously stated three straight lines X1, X2 and X3. In this case, the center can be found from the calculation method for the center position using the previously stated two straight lines X1 and X2 without the coordinates of the straight line interrupting the notch. The center positions are calculated from the intersections with using four straight lines and suitable one may be used from the derived results as a center position. If the straight lines are arranged so that the distance between the straight lines is larger than the width of the notch, the notch is prevented from extending over two straight lines, thereby enabling calculation of accurate center position.

Besides, the existing technique enables to draw a straight line on the place interrupting no notches by adding a function for detecting notches on the edge extracting section 31 or the correction amount calculation section 32.

The mentioned above are explanations for the method for calculating the center position of the semiconductor wafer 5 and the device thereof from the image data captured by one image camera 24. In addition, it is also possible to detect a wafer mark 43 or an alignment mark 44 given on the surface of the semiconductor wafer 5 by adding a new lighting device 42 on the position detecting device 29 and irradiating light on the surface of the semiconductor wafer 5. The wafer mark 43 is an individual identification mark formed on the semiconductor wafer 5 by using laser, which performs process management of the semiconductor wafer 5 by reading during each processing. The alignment mark 44 is a sign for adjusting a direction of the circumference of the semiconductor wafer 5 during each processing, which is formed on the semiconductor wafer 5 by using laser as well as the wafer mark 43.

Figure 13:
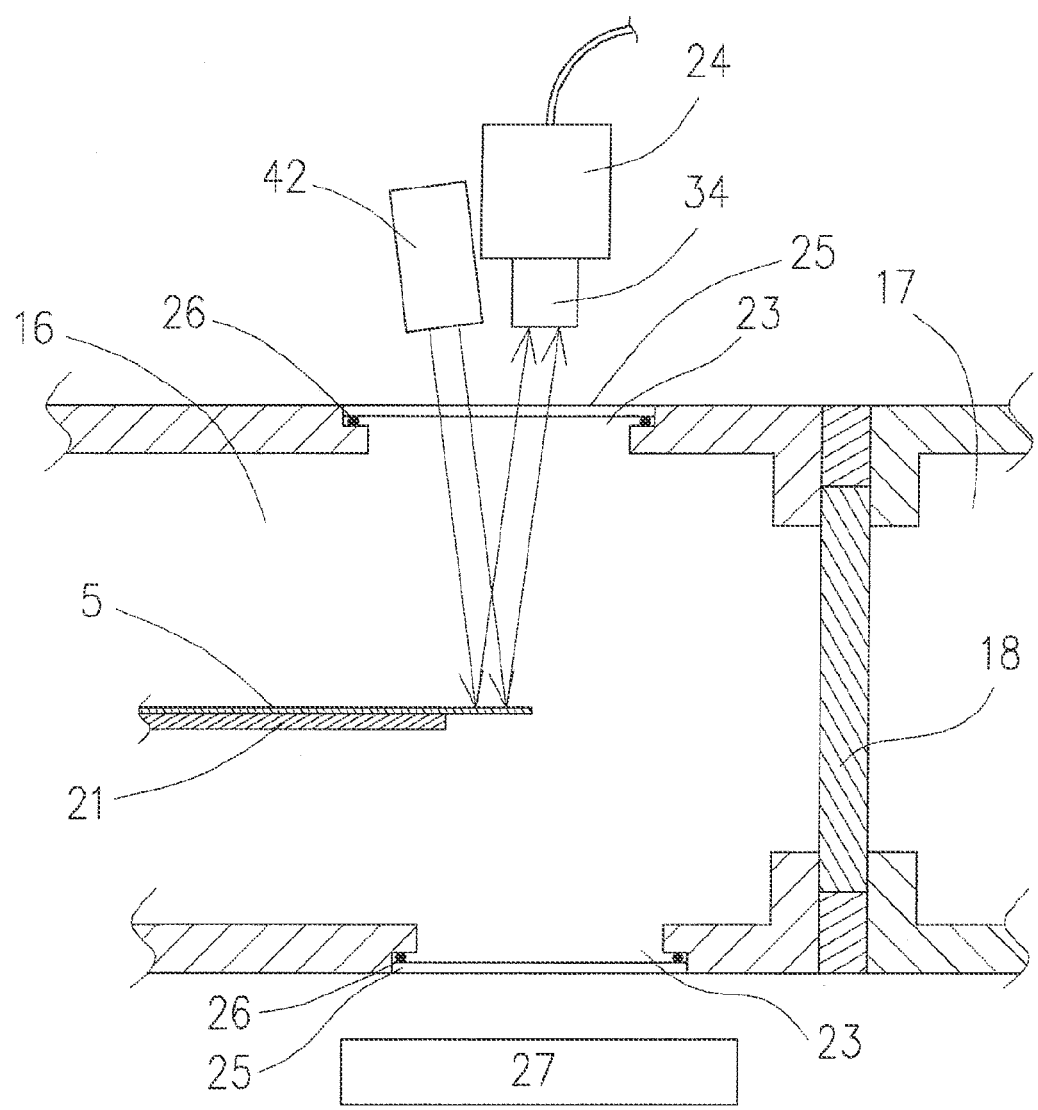
FIG. 13 shows a position detecting device 29 adding a lighting device 42.
Figure 14:
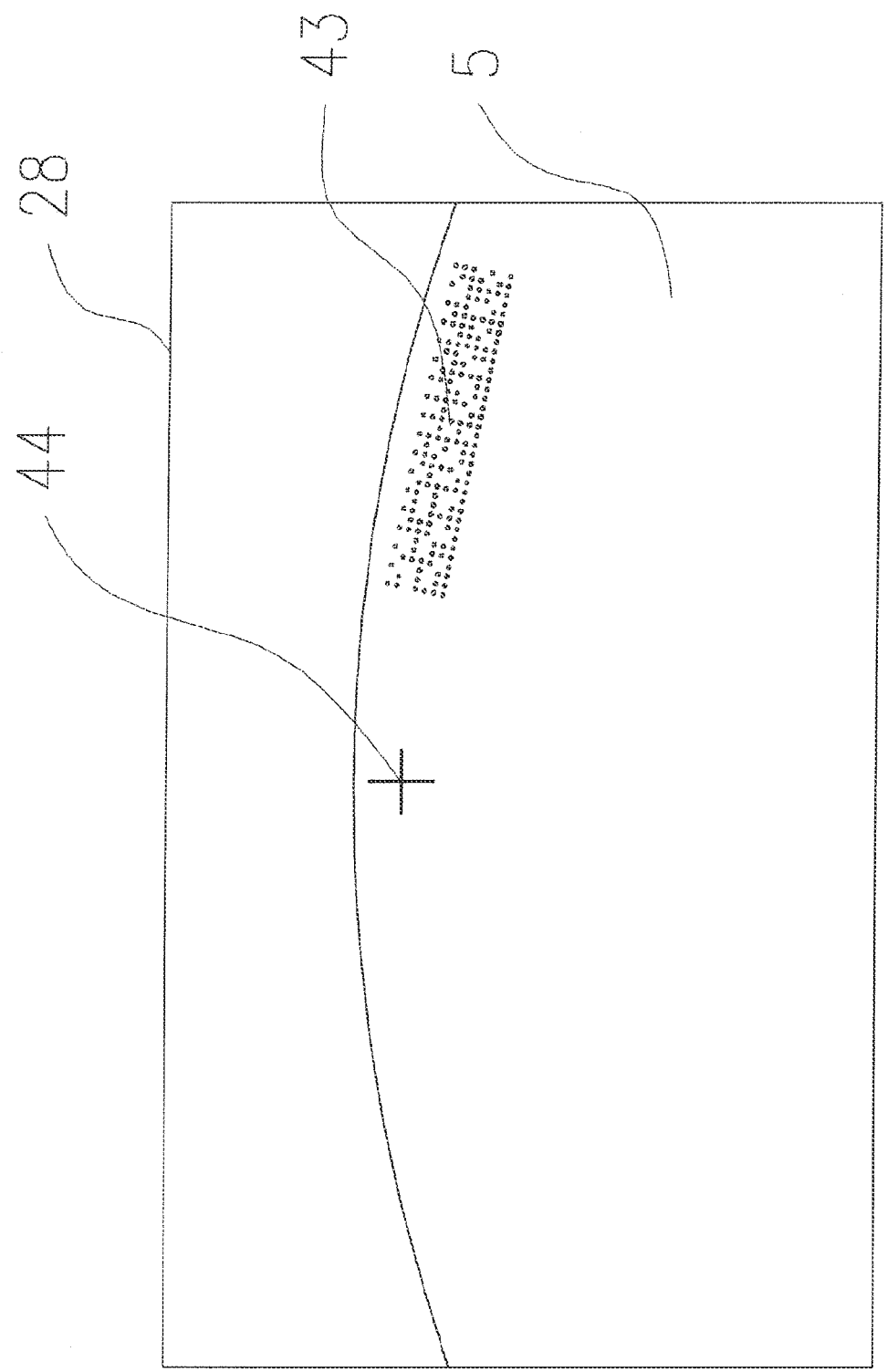
FIG. 14 shows a captured wafer mark 43 and an alignment mark 44.

FIG. 13 shows the position detecting device 29 with being added the new lighting device 42, and FIG. 14 shows a rough outline of the captured wafer mark 43 and alignment mark 44. The lighting device 42 is installed near the image camera 24 on the face of the transport chamber 16 opposing to the other face on which the transmitted illumination device 27 is arranged through the upper view port 23 from above so as to shine the surface of the semiconductor wafer 5. The wafer mark 43 shined through the lighting device 42 is captured by the image camera 24, and the captured image data is coded in character by a not-illustrated reading means and stored in the storage means 30. Here, the stored data are transmitted to a not-illustrated computer for managing process for manufacturing the semiconductor wafer 5.

After the alignment mark 44 shined through the lighting device 42 is captured by the image camera 24, the data is transmitted and stored to the storage means 30 of the position detecting device 29. The stored image data of the alignment mark 44 are converted to coordinate data in the view field 28 by a not-illustrated alignment mark coordinates detecting section and compared with the coordinate data of the most appropriate alignment mark 44 on designing that are previously stored in the storage means 30, and the positional misalignment amount in the circumferential direction of the captured semiconductor wafer 5 is calculated. Besides, in reading the wafer mark 43 or the alignment mark 44, it is desirable to suspend shining light from the transmitted illumination device 27 arranged under the transport chamber 16.

Although the positional misalignment detection of the semiconductor wafer 5 mounted on the vacuum conveyance robot 15, and detecting for the wafer mark 43 or the alignment mark 44 are performed in the above mentioned embodiments, the invention is not be limited to the specific embodiments. For example, the invention may be applicable for the semiconductor wafer 5 clamped by the atmospheric conveyance robot 9. Further, it is possible to perform the positional misalignment detection and the detection for the wafer mark 43 or the alignment mark 44 by the method described in the embodiments if a work has a disc like shape other than the semiconductor wafer 5.

The invention claimed is:

1. A position detecting device for detecting a position of a disc-shaped substrate held by a support member movable along a track parallel to Y-axis, said position detecting device comprising:
   one imaging camera having cells arranged in an orthogonal XY coordinates system, capturing only a part of a periphery of the disc-shaped substrate within a viewing field of an intersection C at which a straight line passing through a center of the disk-shaped substrate in parallel to Y-axis intersects an edge of the disk-shaped substrate when the support member holding the disc-shaped substrate is positioned at a predetermined monitoring position, said intersection C being a top place in Y axis direction on a circumference of the disc-shaped substrate;
   an edge extraction section extracting a Y coordinate value of the intersection C from image data of the periphery of the disc-shaped substrate captured by the imaging camera, then extracting XY coordinate values of another place apart from the intersection C on the edge of the disc-shaped substrate captured within a range of the viewing field; and
   a coordinate detection section detecting coordinates of a center position of the disc-shaped substrate from edge data extracted by the edge extraction section.

2. A position detecting device as claimed in claim 1, wherein the coordinate detection section decides two places apart from the extracted intersection, detecting the coordinates of the center position of the disc-shaped substrate from the edge date of the two places and a radius of the disc-shaped substrate.

3. A position detecting device as claimed in claim 1, wherein the coordinate detection section decides three places apart from the extracted intersection C, detecting the coordinates of the center position of the disc-shaped substrate from the edge date of the three places, finding the radius of the disc-shaped substrate.

4. A position detecting device as claimed in claim 1, further comprising:
   a correction amount calculation section for calculating a correction amount of the support member by calculating an amount of misalignment in an X-axis direction and in a Y-axis direction between the coordinates of the center position of the disc-shaped substrate held on a reamer reference position of the support member and the coordinates of the center position of the disc-shaped substrate positionally misaligned during transporting in manufacturing process.

5. A position detecting method for detecting a position of a disc-shaped substrate held by a support member movable along a track parallel to Y-axis, said position detecting method comprising:
   an imaging process for capturing only a part of a periphery of the disc-shaped substrate by one camera having cells arranged in an orthogonal XY coordinates system within a viewing field of an intersection C at which a straight line passing through a center of the disk-shaped substrate in parallel to Y-axis intersects an edge of the disk-shaped substrate when the support member holding the disc-shaped substrate is positioned at a predetermined monitoring position, said intersection C being a top place in Y axis direction on a circumference of the disc-shaped substrate;
   an edge extracting process for extracting a Y coordinate value of the intersection C from image data of the periphery of the disc-shaped substrate captured by the imaging camera, then extracting XY coordinate values of another place apart from the intersection C on the edge of the disc-shaped substrate captured within a range of the viewing field; and
   a coordinate detecting process for detecting coordinates of a center position of the disc-shaped substrate from edge data extracted by the edge extracting process.

6. A position detecting method as claimed in claim 5, wherein the coordinate detecting process comprises deciding two places apart from the extracted intersection C, detecting the coordinates of the center position of the disc-shaped substrate from the edge date of the two places and a radius of the disc-shaped substrate.

7. A position detecting method as claimed in claim 5, wherein the coordinate detecting process comprises deciding three places apart from the extracted intersection C, detecting the coordinates of the center position of the disc-shaped substrate from the coordinates of the edge data of the three places, finding the radius of the disc-shaped substrate.

8. A position detecting method as claimed in claim 5, further comprising:
- a correction amount calculating process for calculating a correction amount of the support member by calculating an amount of misalignment in an X axis direction and in a Y axis direction between the coordinates of the center position of the disc-shaped substrate held on a reamer reference position of the support member and the coordinates of the center position of the disc-shaped substrate positionally misaligned during transporting in manufacturing process.

* * * * *